(12) United States Patent
Cai

(10) Patent No.: US 12,266,299 B2
(45) Date of Patent: Apr. 1, 2025

(54) DISPLAY AND TERMINAL DEVICE

(71) Applicant: HONOR DEVICE CO., LTD., Shenzhen (CN)

(72) Inventor: Peizhi Cai, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 17/797,939

(22) PCT Filed: Apr. 27, 2022

(86) PCT No.: PCT/CN2022/089664
§ 371 (c)(1),
(2) Date: Aug. 5, 2022

(87) PCT Pub. No.: WO2023/024555
PCT Pub. Date: Mar. 2, 2023

(65) Prior Publication Data
US 2024/0185774 A1 Jun. 6, 2024

(30) Foreign Application Priority Data

Aug. 25, 2021 (CN) .......................... 202110981548.9
Nov. 2, 2021 (CN) .......................... 202111290917.6

(51) Int. Cl.
*G09G 3/3208* (2016.01)
*G02F 1/16757* (2019.01)
*G02F 1/1676* (2019.01)

(52) U.S. Cl.
CPC ....... *G09G 3/3208* (2013.01); *G02F 1/16757* (2019.01); *G02F 1/1676* (2019.01)

(58) Field of Classification Search
CPC ................................................ G09G 2300/046
See application file for complete search history.

(56) References Cited

U.S. PATENT DOCUMENTS

| 9,419,060 B2 | 8/2016 | Kim et al. |
| 10,627,694 B1 * | 4/2020 | Wang ................... G09G 3/2092 |
| 2007/0024954 A1 | 2/2007 | Sakamoto et al. |
| 2009/0147185 A1 | 6/2009 | Quach |

(Continued)

FOREIGN PATENT DOCUMENTS

| CN | 101889245 A | 11/2010 |
| CN | 102043284 A | 5/2011 |

(Continued)

*Primary Examiner* — Robin J Mishler
(74) *Attorney, Agent, or Firm* — WOMBLE BOND DICKINSON (US) LLP

(57) ABSTRACT

This application provides a display and a terminal device. The display includes a cover plate, a composite display layer, and a first substrate from top to bottom, where the composite display layer includes an ink filling layer and an emissive display module layer the emissive display module layer includes a plurality of pixels, each pixel includes an effective light transmitting zone and a non-effective light transmitting zone, and the effective light transmitting zone includes an emissive luminescent material: the ink filling layer includes a first zone corresponding to the effective light transmitting zone and a second zone corresponding to the non-effective light transmitting zone, and the second zone is filled with an electronic ink material.

19 Claims, 19 Drawing Sheets

(56) References Cited

U.S. PATENT DOCUMENTS

| | | | | |
|---|---|---|---|---|
| 2012/0032175 | A1* | 2/2012 | Wang | .................... H10K 59/50 257/59 |
| 2015/0309384 | A1 | 10/2015 | Zhang et al. | |
| 2017/0219900 | A1 | 8/2017 | Kim et al. | |
| 2018/0052321 | A1* | 2/2018 | Kong | .................... G02B 27/01 |

FOREIGN PATENT DOCUMENTS

| | | | |
|---|---|---|---|
| CN | 103955099 | A | 7/2014 |
| CN | 104241327 | A | 12/2014 |
| CN | 106199948 | A | 12/2016 |
| CN | 106997120 | A | 8/2017 |
| CN | 110007541 | A | 7/2019 |
| CN | 110133938 | A | 8/2019 |
| CN | 110444125 | A | 11/2019 |

* cited by examiner

DISPLAY AND TERMINAL DEVICE

This application is a National Stage of International Application No. PCT/CN2022/089664, filed Apr. 27, 2022, which claims priority to Chinese Patent Application No. 202110981548.9, filed Aug. 25, 2021 and Chinese Patent Application No. 202111290917.6, filed Nov. 2, 2021, both of which are hereby incorporated by reference in their entireties.

TECHNICAL FIELD

This application relates to the field of image display, and specifically, to a display and a terminal device.

BACKGROUND

An electronic ink display is a reflective display. When external ambient light is incident on the display, the light is reflected out of the display by ink particles to implement developing. Compared with a liquid crystal display (Liquid Crystal Display, LCD), the electronic ink display does not need a backlight unit to serve as a backlight source. Compared with an organic light-emitting diode (Organic Light-Emitting Diode, OLED) display, the electronic ink display does not need to excite an organic light-emitting diode to emit light. Therefore, the electronic ink display has an advantage of low power consumption.

At present, relatively mature electronic ink display solutions include: 1. microcapsule electronic ink display; and 2. electrowetting electronic ink display. The microcapsule electronic ink display is subject to a retarding effect of filling liquid in microcapsules. As a result, ink particles move at a limited speed, and the display is refreshed at a low speed, which cannot be adapted to dynamic content display. In addition, in terms of color display, the microcapsule electronic ink display adopts a printed color light filter film to display colors by superimposing different levels of gray displayed by the microcapsules and a corresponding color of pixels in the color light filter film. Different levels of gray of the microcapsules are discretely displayed and are limited in number, and therefore types of displayed colors are highly limited and full color gamut display cannot be implemented.

The electrowetting electronic ink display utilizes a surface tension property of liquid to control ink droplets to spread and contract on a hydrophobic layer to implement imaging. Because the ink droplets are agile in shape changing, the electrowetting electronic ink display has a higher refresh rate and a better effect in displaying dynamic content such as videos and GIFs, compared with the microcapsule display. In terms of color display, to implement full color gamut display, the electrowetting display is formed by using three stacked electrowetting structures, and pixels of the three stacked electrowetting structures are sequentially filled with red, green, and blue ink droplets. Shape changing of the ink droplets is continuous, so superposition of three primary color components can implement full color gamut display. However, such structure increases a device thickness of the display, not in line with a current design idea of making terminals thinner and lighter. In addition, blocked out by the upper electrowetting structure, incident light for the bottom electrowetting structure is weakened, resulting in low light reflectivity and color unsaturation.

To further reduce a display thickness while implementing full color gamut display, a "semi-emissive and semi-reflective" display is proposed in the prior art. The display is formed by stacking one emissive display layer and one reflective display layer. The emissive display layer is made of a display material such as an LCD or OLED. The reflective display layer is made of an ink material. The emissive display layer includes first pixel zones and second pixel zones that are alternately arranged. The first pixel zone includes three adjacent pixels for displaying a color image, and the second pixel zone leaves vacancy for three adjacent pixels, to permit passage of a grayscale image displayed by the lower reflective display layer. Because the first pixel zones and the second pixel zones are alternately arranged, pixels per inch (Pixels Per Inch, PPI) of the display is reduced. Consequently, a display resolution significantly decreases and a high-definition image cannot be displayed.

SUMMARY

The technical solutions of this application provide a display and a terminal device, to stack a reflective display layer and an emissive display layer at a pixel level to avoid a PPI decrease of the display.

According to a first aspect, this application provides a display. The display includes a cover plate, a composite display layer, and a first substrate from top to bottom, and the composite display layer includes an ink filling layer and an emissive display module layer;

the emissive display module layer includes a plurality of pixels, each pixel includes an effective light transmitting zone and a non-effective light transmitting zone, and the effective light transmitting zone includes an emissive luminescent material;

the ink filling layer includes a first zone corresponding to the effective light transmitting zone and a second zone corresponding to the non-effective light transmitting zone, and the second zone is filled with an electronic ink material; and the display includes a thin-film transistor TFT electrode layer, the TFT electrode layer corresponds to the non-effective light transmitting zone, the ink filling layer is connected to the TFT electrode layer by using a first drive data cable, and the emissive display module layer is connected to the TFT electrode layer by using a second drive data cable.

According to the display provided in this application, the reflective display layer and the emissive display layer are stacked at a granularity of pixel, so that each pixel can switch between a grayscale display mode and a color display mode. Therefore, compared with the prior art, the display has no display PPI decrease and ensures a display resolution In an implementation of the first aspect, the ink filling layer is located above the emissive display module layer.

In an implementation of the first aspect, the display further includes a second substrate, the second substrate is located between the ink filling layer and the emissive display module layer, and the TFT electrode layer is located on a side of the non-effective light transmitting zone adjacent to the first substrate; and a micro through-hole is provided in the second substrate, and the first drive data cable enters the non-effective light transmitting zone through the micro through-hole and is connected to the TFT electrode layer.

In an implementation of the first aspect, the display further includes a second substrate, the second substrate is located between the ink filling layer and the emissive display module layer, and the TFT electrode layer is located on a side of the second zone adjacent to the second substrate; and a micro through-hole is provided in the second substrate, and the second drive data cable enters the second zone through the micro through-hole and is connected to the TFT electrode layer.

According to the display provided in this application, the second substrate is added at the composite display layer, strengthening a structure of the composite display layer. The second substrate is provided with a hole to allow the ink filling layer and the emissive display module layer to share the TFT electrode layer, simplifying a manufacturing process of the display.

In an implementation of the first aspect, the first zone is filled with a transparent resin material.

The transparent resin material has high light transmittance, so that in the color display mode, light from the effective light transmitting zone under the first zone can effectively and completely pass through the reflective display layer to form a color image.

In an implementation of the first aspect, the first zone is covered with a color light filter film, and a color of the color light filter film is the same as a pixel color in the effective light transmitting zone.

The color light filter film can effectively reduce reflection of a cathode layer in the effective light transmitting zone, avoiding chromatic aberration caused by lightening of a displayed color.

In an implementation of the first aspect, the ink filling layer is located below the emissive display module layer.

In an implementation of the first aspect, the display further includes a second substrate, the second substrate is located between the ink filling layer and the emissive display module layer, and the TFT electrode layer is located on a side of the second zone adjacent to the first substrate; and
 a micro through-hole is provided in the second substrate, and the second drive data cable enters the second zone through the micro through-hole and is connected to the TFT electrode layer.

In an implementation of the first aspect, the display further includes a second substrate, the second substrate is located between the ink filling layer and the emissive display module layer, and the TFT electrode layer is located on a side of the first zone adjacent to the first substrate; and
 a micro through-hole is provided in the second substrate, and the second drive data cable enters the first zone through the micro through-hole and is connected to the TFT electrode layer.

According to the display provided in this application, the second substrate is added at the composite display layer, strengthening a structure of the composite display layer. The second substrate is provided with a hole to allow the ink filling layer and the emissive display module layer to share the TFT electrode layer, simplifying a manufacturing process of the display.

In an implementation of the first aspect, the effective light transmitting zone is covered with a color light filter film, and a color of the color light filter film is the same as a pixel color in the effective light transmitting zone.

The color light filter film can effectively reduce reflection of a cathode layer in the effective light transmitting zone, avoiding chromatic aberration caused by lightening of a displayed color.

In an implementation of the first aspect, the TFT electrode layer includes an ink driven electrode layer and an emissive display driven electrode layer.

In an implementation of the first aspect, the ink driven electrode layer and the emissive display driven electrode layer are stacked together.

In an implementation of the first aspect, the ink driven electrode layer and the emissive display driven electrode layer are provided at a same layer.

In an implementation of the first aspect, the cover plate or the substrate is a glass base material.

Using a glass substrate or a glass cover plate can increase support strength of the display.

In an implementation of the first aspect, the cover plate or the substrate is a flexible base material.

Replacing the glass substrate/cover plate with a flexible base material can reduce a thickness of the display.

In an implementation of the first aspect, in a grayscale display mode, the TFT electrode layer controls the second zone of the ink filling layer to display grayscale effects, and controls the effective light transmitting zone of the emissive display module layer to turn black.

In an implementation of the first aspect, in a color display mode, the TFT electrode layer controls the effective light transmitting zone of the emissive display module layer to turn colored, and controls the second zone of the ink filling layer to turn black.

According to the display provided in this application, the reflective display layer and the emissive display layer are stacked in an up-and-down stacking direction, and switching between reflective display and emissive display is implemented through switching between the color display mode and the grayscale display mode.

In an implementation of the first aspect, the second zone is filled with a microcapsule ink material or an electrowetting ink material.

In an implementation of the first aspect, the emissive display layer is an organic light-emitting diode OLED display layer.

The OLED display layer features high brightness, fast response, and high definition, and therefore can improve the display effect in the color display mode. In addition, an aperture ratio of an OLED pixel is small, and a non-effective light transmitting zone occupies a large area of the pixel. An ink material may be added to the second zone with a larger area at the reflective display layer to increase a pixel aperture ratio at the ink display layer, so as to improve the display effect in the grayscale display mode.

In an implementation of the first aspect, the second zone is filled with an electrowetting ink material, and the emissive display module layer is an OLED display layer, where
 in the second zone, a transparent hydrophobic layer is disposed below ink droplets, and a reflective metal layer is disposed on a side of the transparent hydrophobic layer facing away from the ink droplets; and
 the effective light transmitting zone includes a cathode layer, an electron injection layer, an electron transport layer, an organic self-luminous layer, a hole transport layer, a hole injection layer, and an anode layer from top to bottom, where the organic self-luminous layer is added with organic display materials of different colors.

According to a second aspect, this application provides a terminal device, where the terminal device includes the display according to the first aspect.

It can be understood that for beneficial effects of the terminal device provided according to the second aspect, reference may be made to the beneficial effects in the first aspect and any implementation thereof. Details are not repeated herein.

DESCRIPTION OF EMBODIMENTS

Figure 1:
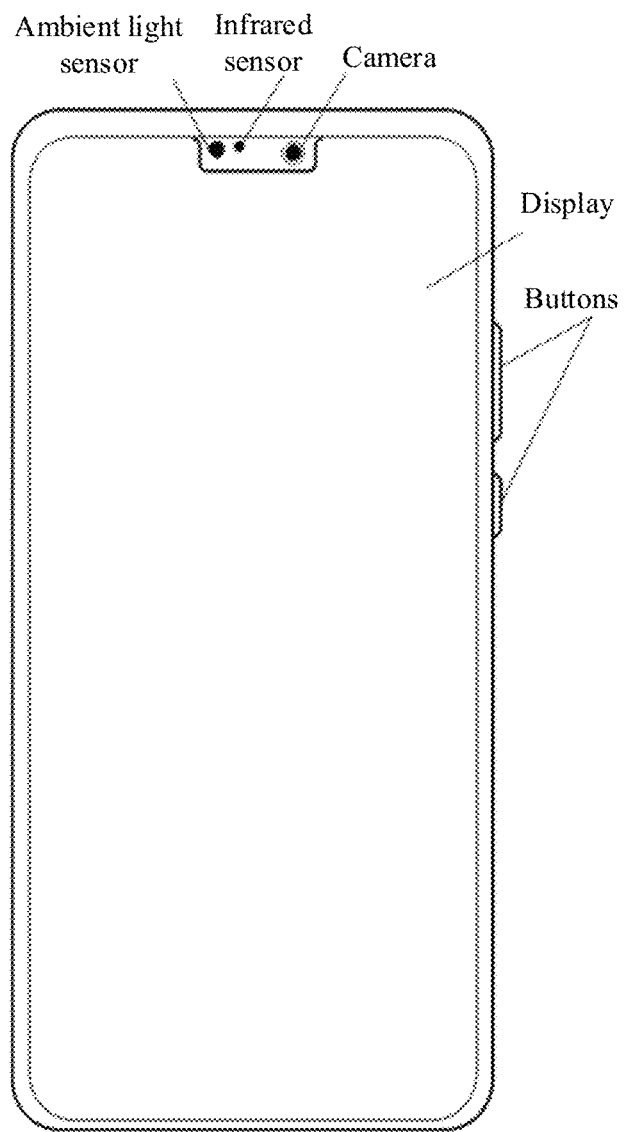
FIG. 1 is a schematic structural diagram of a terminal according to an embodiment of this application.

The following describes technical solutions of this application with reference to accompanying drawings. Obviously, the described embodiments are merely some but not all of the embodiments of this application.

In addition, the terms such as "first" and "second" are merely intended for a purpose of description, and shall not be understood as an indication or implication of relative importance or an implicit indication of the number of the indicated technical features. Therefore, a feature limited by "first", "second", or the like may explicitly or implicitly include one or more features.

In addition, in this application, the orientation terms such as "central", "upper", "lower", "left", "right", "top", and "bottom" are defined with respect to the schematic orientation or location of the accompanying drawings. It should be understood that these directional terms are relative concepts, are used in relative description and clarification, are not intended to indicate or imply that the apparatuses or components mentioned must have specific orientations or be constructed and operated for a specific orientation, and may correspondingly change with the placed orientation of the components in the drawings, and therefore shall not be construed as a limitation to this application.

It should also be noted that in the embodiments of this application, a same component or a same part is represented by a same reference numeral. For a same part in the embodiments of this application, a reference numeral for only one part or component may be used as an example in the figure, and it should be understood that the reference numeral applies to other identical parts or components.

In this application, a terminal may include a handheld device, a vehicle-mounted device, a wearable device, a computing device, or another processing device connected to a wireless modem. The terminal may also include a cellular phone (cellular phone), a smart phone (smart phone), a personal digital assistant (personal digital assistant, PDA) computer, a tablet computer, a laptop computer (laptop computer), a machine type communication (machine type communication, MTC) terminal, a point of sale (point of sale, POS), an in-vehicle computer, and another terminal with an imaging capability. In the embodiments of this application, the terminal may also be referred to as a terminal device.

Figure 2:
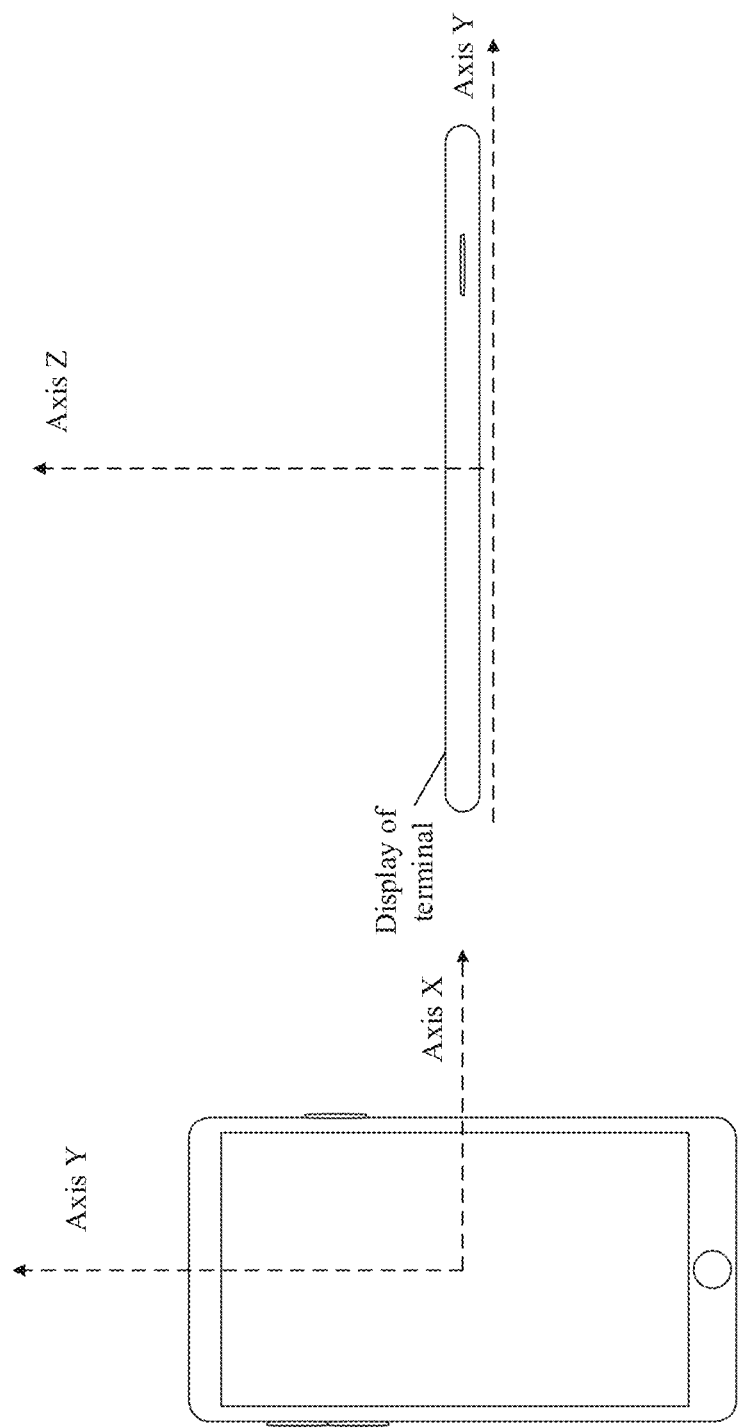
FIG. 2 is a schematic diagram of three-axis posture of a terminal according to an embodiment of this application.

The embodiments of this application impose no special limitation on a specific form of the terminal. For ease of description and understanding, an example in which the terminal is a mobile phone is used for description in this application. As shown in FIG. 1, the terminal includes components such as a display, buttons, a camera, an infrared sensor, and an ambient light sensor. The terminal further includes internal components such as a processor, an internal memory, an antenna, a speaker, a receiver, and a gravity sensor (not shown in the figure). This application proposes a design solution for a display. For ease of description, this application first defines three axis directions of the terminal. As shown in FIG. 2, facing toward the display of the terminal, a short side of the terminal is defined as an axis-X direction, a long side of the terminal is defined as an axis-Y direction, and a direction that is perpendicular to the display of the terminal and that is of emergent light of the display is an axis-Z direction. The "direction of emergent light of the display" mentioned later in this application is the axis-Z direction in FIG. 2, and "from top to bottom of the display" is a direction opposite to the axis Z, namely, an incident direction of ambient light.

Display principles of a microcapsule display and an electrowetting display are described below:

1. Microcapsule Display

Figure 3:
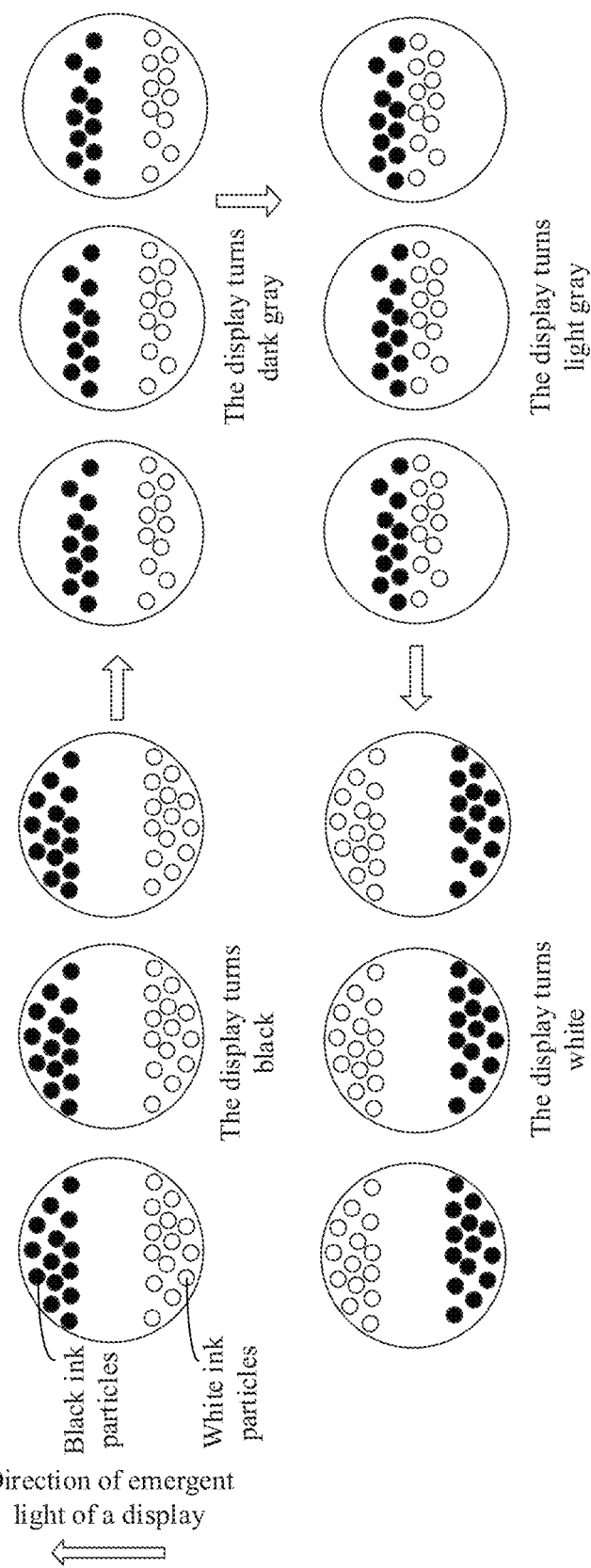
FIG. 3 is a schematic diagram of a display principle of a microcapsule electronic ink display.

As shown in FIG. 3, the microcapsule display includes countless microcapsules, and the microcapsule is filled with a plurality of black ink particles and a plurality of white ink particles. The ink particles of the two colors have opposite charges. In addition, transparent filling liquid for supporting suspension of the ink particles is also added between the ink particles. When a forward voltage is applied to the microcapsule, the black ink particles move to the top of the microcapsule, and the white ink particles move to the bottom of the microcapsule. In this case, ambient light outside the display is reflected by the black ink particles after irradiating into the display, and the display turns black to naked eyes. When a reverse voltage is applied to the microcapsule, the two types of ink particles move in an opposite way, and the display turns white.

At present, in addition to displaying black and white, most microcapsule displays support a grayscale display mode, such as GC4, GC8, or GC16. GC means grayscale clearing, and 4, 8, or 16 indicates the maximum levels of gray supported by different modes. At present, an electronic ink display can support up to 16 levels of gray for display. For example, a GC16 mode provides a total of 16 levels of grayscale display effects from 0 to 15, where level 0 corresponds to white, level 15 corresponds to black, and levels 1 to 14 correspond to increasingly darkening gray colors between white and black. Certainly, in practical application, there are also solutions in which level 0 is defined as black and level 15 is defined as white, which is not limited in the embodiments of this application. When different levels of gray between black and white are displayed, the black and white ink particles are no longer driven to the top or bottom of the microcapsule, but move to and suspend at specified locations in the microcapsule, so as to meet requirements of displaying different levels of gray.

Figure 4:
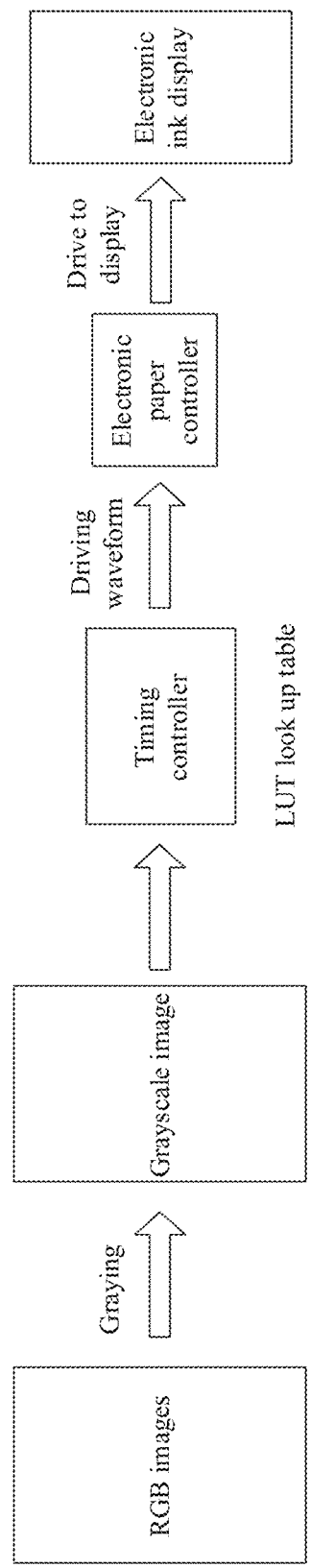
FIG. 4 is a schematic flowchart of image display of a microcapsule electronic ink display.

As shown in FIG. 4, when a frame of image is being displayed, firstly, an RGB image is subjected to graying to convert RGB values of each pixel in the image into 16-level grayscale values, and then a timing controller circuit performs a look up table (Look Up Table, LUT) operation to obtain a driving waveform (waveform) of the pixel. The driving waveform includes a current/voltage, a pulse duration, a pulse period, and other information that the pixel needs to display the current frame. After receiving a driving waveform corresponding to each pixel in the current frame, an electronic paper controller drives a microcapsule corresponding to the pixel of the electronic ink display based on a drive parameter carried by the driving waveform, to control each of black and white ink particles in the microcapsule to move from a current location to a next location, so that the electronic ink display is refreshed to display content of a next frame of image.

An LUT table is an electronic ink display drive mapping table that an electronic ink display supplier obtains and records based on display hardware testing. The table records driving waveforms of pixels that correspond to different display requirements/conditions. Dependent variables affecting the mapping table generally include: a next-frame gray level of the pixel, a previous-frame gray level of the pixel, and a current display temperature. The next-frame gray level of the pixel determines a moved-to location of an ink particle, and the previous-frame gray level of the pixel corresponds to a current location of the ink particle. The display temperature needs to be taken into account because viscosity of filling liquid in microcapsules varies under different temperatures. For a same driving waveform, higher viscosity of the filling liquid means that an ink particle is more difficult to move. If a moving distance of the ink particle is insufficient, a display becomes too dark or too light, affecting a display effect. Therefore, it is necessary to adjust the driving waveform based on a current display temperature to ensure that the ink particle can accurately move to designated locations under different temperatures, so as to achieve sufficient and accurate grayscale presentation. Generally, viscosity of filling fluid is negatively correlated with a temperature, that is, a lower temperature indicates greater viscosity of the filling fluid.

In the LUT table, all permutations and combinations of the three parameters of "next-frame gray level", "previous-frame gray level", and "current display temperature" are given, and each permutation and combination is mapped to one corresponding driving waveform parameter to form the above mapping table. During the look up table operation, the timing controller circuit obtains a next-frame grayscale image from a system on chip (System on Chip, SOC), and obtains a gray level of each pixel therefrom; and then obtains a previous-frame grayscale image from a cache, and obtains a gray level of each pixel in the previous frame. Then, the timing controller circuit queries the SOC for temperature data of the electronic ink display. The data is monitored and obtained by a temperature sensor disposed inside the terminal and close to a backlight plate of the electronic ink display, and transmitted to the SOC. After obtaining the data, the timing controller circuit uses the three pieces of data as dependent variables to look up a corresponding driving waveform in the LUT table. After driving waveforms corresponding to all pixels in a frame of image are obtained, the look up table process is completed.

2. Electrowetting Display

Figure 5:
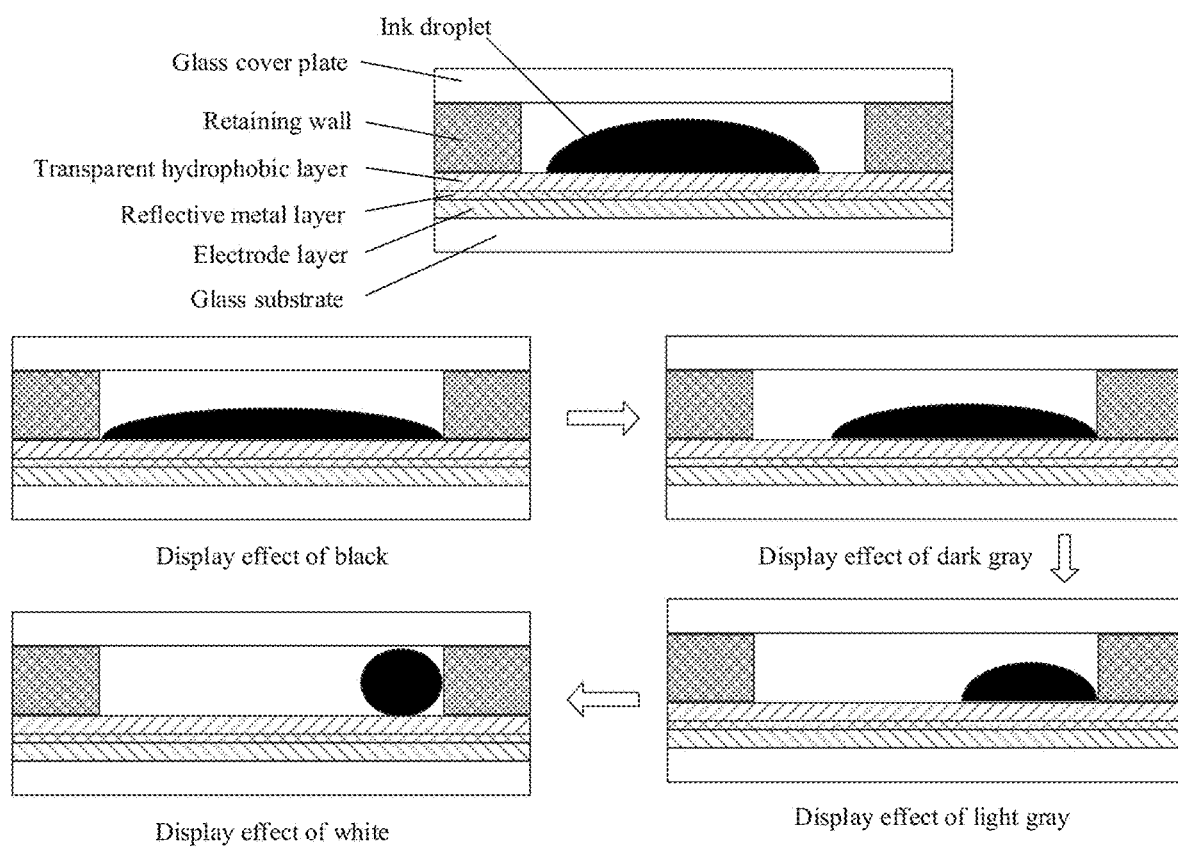
FIG. 5 is a schematic diagram of a display principle of an electrowetting electronic ink display.

As shown in FIG. 5, an electrowetting display structurally includes a glass cover plate, a retaining wall, a transparent hydrophobic layer, a reflective metal layer, an electrode layer, and a glass substrate from top to bottom. Black oily ink droplets, also referred to as ink droplets, are added at the transparent hydrophobic layer. When the ink droplets spread all over the entire transparent hydrophobic layer, the ink droplets completely block the reflective metal layer under the transparent hydrophobic layer. Ambient light outside the display irradiates on the ink droplets, and then is reflected by the ink droplets out of the display to present a black color. When the ink droplets contract to corners of the hydrophobic layer, the reflective metal layer under the hydrophobic layer is exposed from most zones of pixels. Ambient light outside the display irradiates on the reflective metal layer, and then is reflected by the reflective metal layer out of the display to present a white color.

When the ink droplets are in a state between the foregoing two boundary states, a gray tone can be displayed through joint reflection by the black ink droplets and the reflective metal layer. Different levels of gray from light to dark can be displayed by adjusting a proportion of occlusion by ink droplets. Unlike the microcapsule display, the ink droplets have a smooth and continuous shape changing process, and therefore can theoretically display infinite grayscale effects between white and black.

In the prior art, it takes time, usually more than 150 ms, for black and white ink particles in a microcapsule display to move. Particularly, in a low temperature environment, affected by increased viscosity of filling liquid, such time can be more than 200 ms. In a global refresh mode, such time is further increased to be more than 340 ms, which severely limits a display refresh rate and is not suitable for dynamic content display. Taking a minimum dynamic frame rate of 15 frames per second for example, a refresh time of one frame of image does not exceed 67 ms. Obviously, the microcapsule display cannot reach this refresh rate.

The so-called global refresh means performing screen clearing once before driving black and white ink particles from a location (for example, gray level 5) corresponding to a current frame of image to a location (for example, gray level 8) corresponding to a next frame of image, to drive all the black ink particles to the bottom of a microcapsule and drive all the white ink particles to the top of the microcapsule, so that the black and white ink particles are then driven from the bottom or top to the location corresponding to the next frame of image (a location corresponding to gray level 8). Significance of the global refresh is to eliminate a screen ghost image accumulated by multiple local refreshes. Because there is a small error in moving distances of the ink particles during each refresh, such distance error grows to an extent that can be observed by naked eyes after multiple refreshes, resulting in the ghost image. The black and white ink particles can be "reset" by the global refresh before the next frame of image is displayed, and then driven to the required locations, thereby eliminating accumulation of errors.

A refresh rate of the electrowetting display is much higher than that of the microcapsule display. Ink droplets of the electrowetting display change more quickly in response to driving waveforms, and resistance between the ink droplets and the transparent hydrophobic layer is nearly zero, offering the electrowetting display an incomparable advantage over the microcapsule display in terms of refresh rate. The electrowetting display usually needs 20 ms to 30 ms to refresh a frame of image, and can better adapt to display of dynamic content such as waterfall pages, UI animation, GIFs, and videos.

Figure 6:
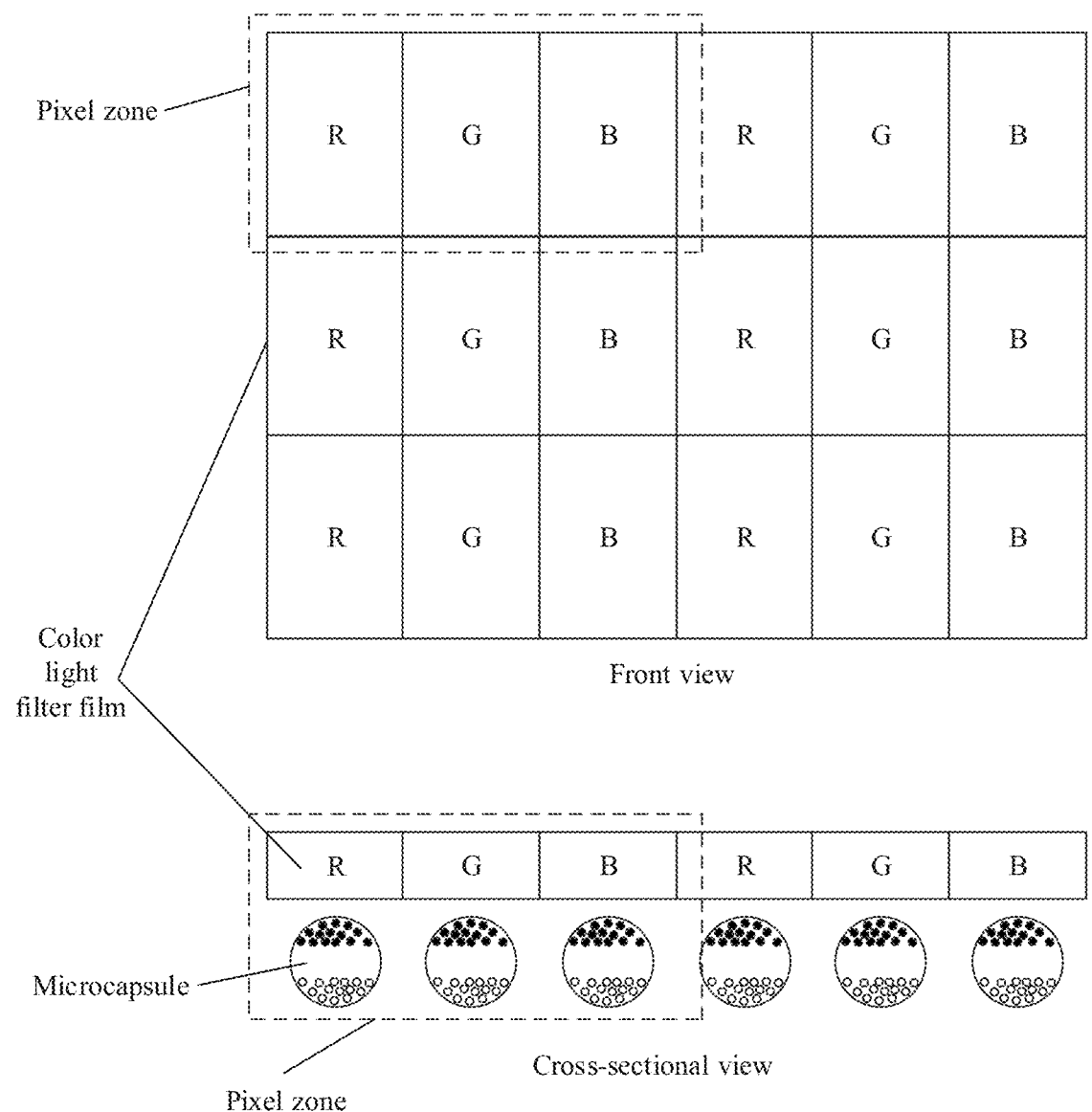
FIG. 6 is a schematic structural diagram of a color microcapsule electronic ink display.

In terms of color display, the microcapsule display adopts a printed color electronic paper technology that prints a layer of color light filter film on the microcapsule layer. As shown in FIG. 6, a front view of FIG. 6 is based on an observation perspective opposite to an axis Z, that is, a perspective of looking towards a display, and a section of a cross-sectional view is parallel to an XZ plane. For the color light filter film, adjacent R, G, and B light filtering zones are used as a pixel zone, and each pixel zone vertically corresponds to three adjacent pixels of the lower microcapsule layer, and gray level changes of pixels present different colors through the color light filter film. As mentioned above, each pixel supports a maximum of 16 gray levels, meaning that one pixel zone on the color light filter film can display only a total of 16*16*16, namely, 4096 colors at most, which strictly limits a color gamut and is far from satisfying usage requirements.

Figure 7:
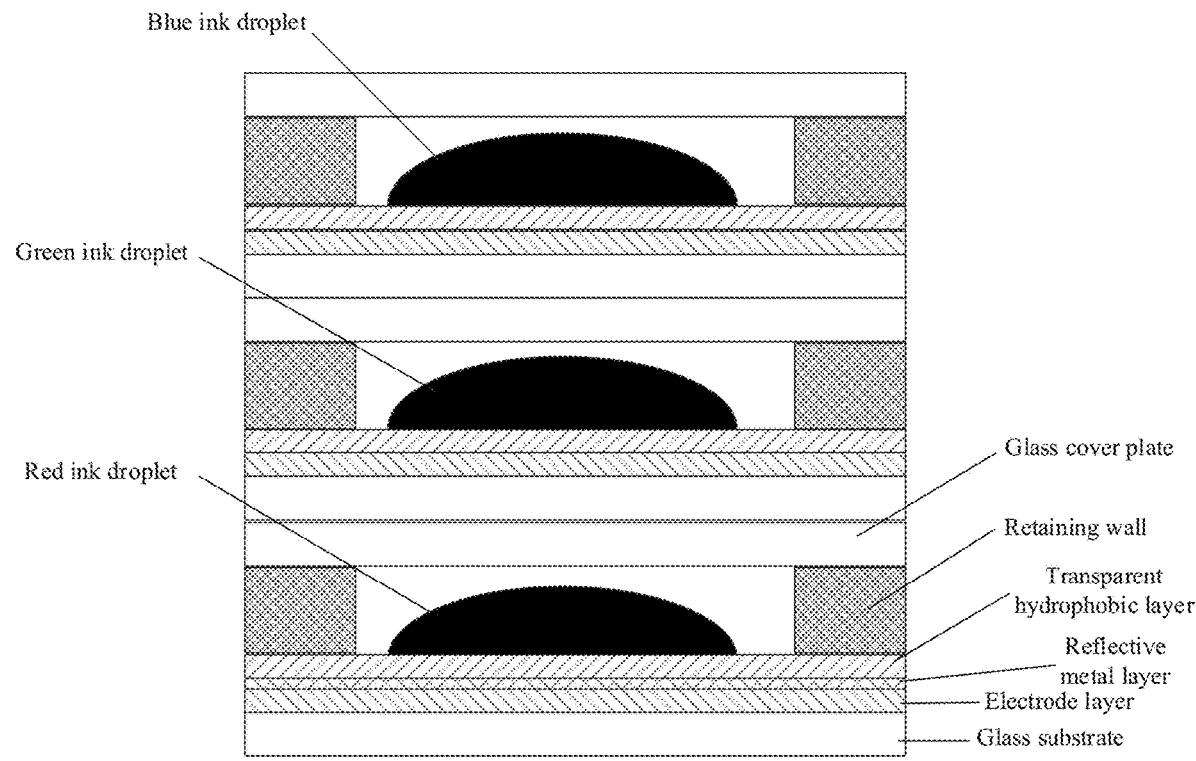
FIG. 7 is a schematic structural diagram of a color electrowetting electronic ink display.

By contrast, the electrowetting display has three separate electrowetting layers stacked. As shown in FIG. 7, a bottom electrowetting layer is filled with red ink droplets, and a middle electrowetting layer is filled with green ink droplets, and a top electrowetting layer is filled with blue ink droplets. As mentioned above, ink droplets have a smooth and continuous shape changing process, and can output almost infinite grayscale effects. Therefore, a much wider color gamut is supported by a display of three stacked layers.

However, this solution cannot overcome a problem that a display device is excessively thick. For example, in a structure shown in FIG. 7, an electrowetting layer includes a glass cover plate, a retaining wall, a transparent hydrophobic layer, an electrode layer, and a glass substrate from top to bottom. For ease of light reflection by a bottom electrowetting layer, reflective metal layers of a top electrowetting layer and a middle electrowetting layer are removed, and only a reflective metal layer of the bottom electrowetting layer is retained. After irradiating into the display, external light passes through blue, green and red electrowetting structures in turn, and is reflected out of the display by the bottom metal reflective layer.

For any electrowetting layer, a glass cover plate or glass substrate is about 0.3 mm thick, which can be reduced to 0.15 mm through an acid etching process. For ease of description, 0.15 mm is used as a thickness of a glass cover plate/substrate in the following descriptions of this application. Generally, the ink droplet layer, the transparent hydrophobic layer, the electrode layer, and the metal reflective layer each have a thickness of less than 5 μm, which is negligible compared with the thickness of the glass cover plate/substrate. It can be learned that in the structure shown in FIG. 7, a thickness of one electrowetting layer is approximately a sum of a thickness of a glass cover plate and a thickness of a glass substrate, that is, about 0.3 mm. An overall thickness of the three stacked electrowetting layers reaches 0.9 mm. Compared with a traditional electrowetting display, LCD display, or OLED display (one glass cover plate layer+one glass substrate layer), the display doubles in thickness.

It should be noted that for ease of displaying a shape of an ink droplet, a display layer in which the ink droplet is located is enlarged in FIG. 5 and FIG. 7, and thicknesses of layers in the figures do not indicate real thicknesses in practical application. This is not noted for subsequent drawings of this application.

To further reduce a display thickness while implementing full color gamut display, a "semi-emissive and semi-reflective" display is proposed in the prior art. Emissive display is a display manner using LCD, OLED, micro LED, or the like, in which light is generated inside a display, passes through the display, and enters human eyes to implement imaging. Reflective display is a display manner using the above-mentioned microcapsules or electrowetting electric paper.

Figure 8:
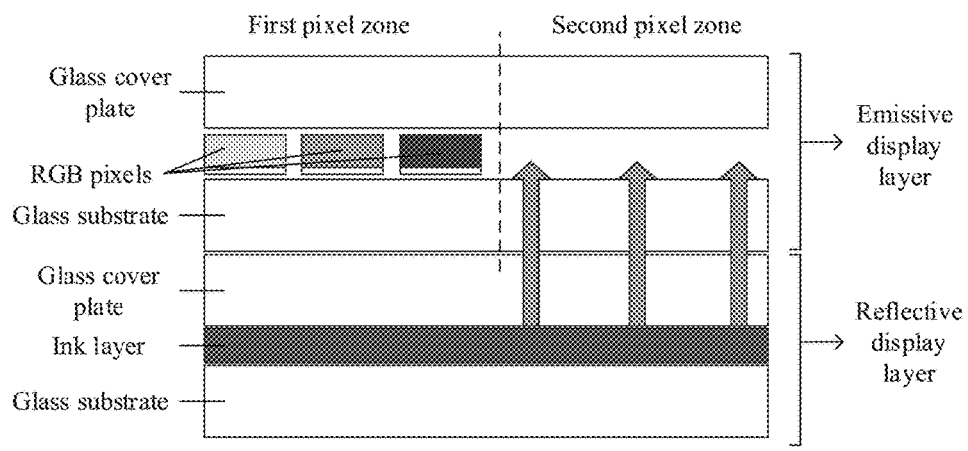
FIG. 8 is a schematic structural diagram of a semi-emissive and semi-reflective display.

As shown in FIG. 8, in this solution, a display includes one emissive display layer and one reflective display layer from top to bottom, and the emissive display layer includes first pixel zones and second pixel zones that are alternately arranged. The first pixel zone includes three adjacent pixels on the left of the figure, which correspond to R, G, and B pixels of the emissive display layer. The second pixel zone leaves vacancy for three adjacent pixels to transmit content displayed by the lower reflective display layer.

In a color display mode, RGB pixels at the emissive display layer are used for full gamut color display, and the reflective display layer displays black to reduce display interference with the emissive display layer. In a black and white display mode, the reflective display layer displays a corresponding level of gray based on a requirement, and the RGB pixels at the emissive display layer are de-energized to be displayed in black, so as to reduce display interference with the reflective display layer.

It can be seen that the structure shown in FIG. 8 includes only four glass cover plate/substrate layers, and has an overall thickness controlled around 0.6 mm, reduced by one third compared with the structure shown in FIG. 7 while ensuring full color gamut display. However, the alternate arrangement of the first and second pixel zones decreases a display PPI by half, greatly reducing a display resolution and making it impossible to display a high-definition image.

In view of this, this application proposes a pixel-level display integration solution that an emissive display structure and a reflective display structure are stacked at a pixel level, to avoid a display PPI decrease of the solution in FIG. 8.

Figure 9A:
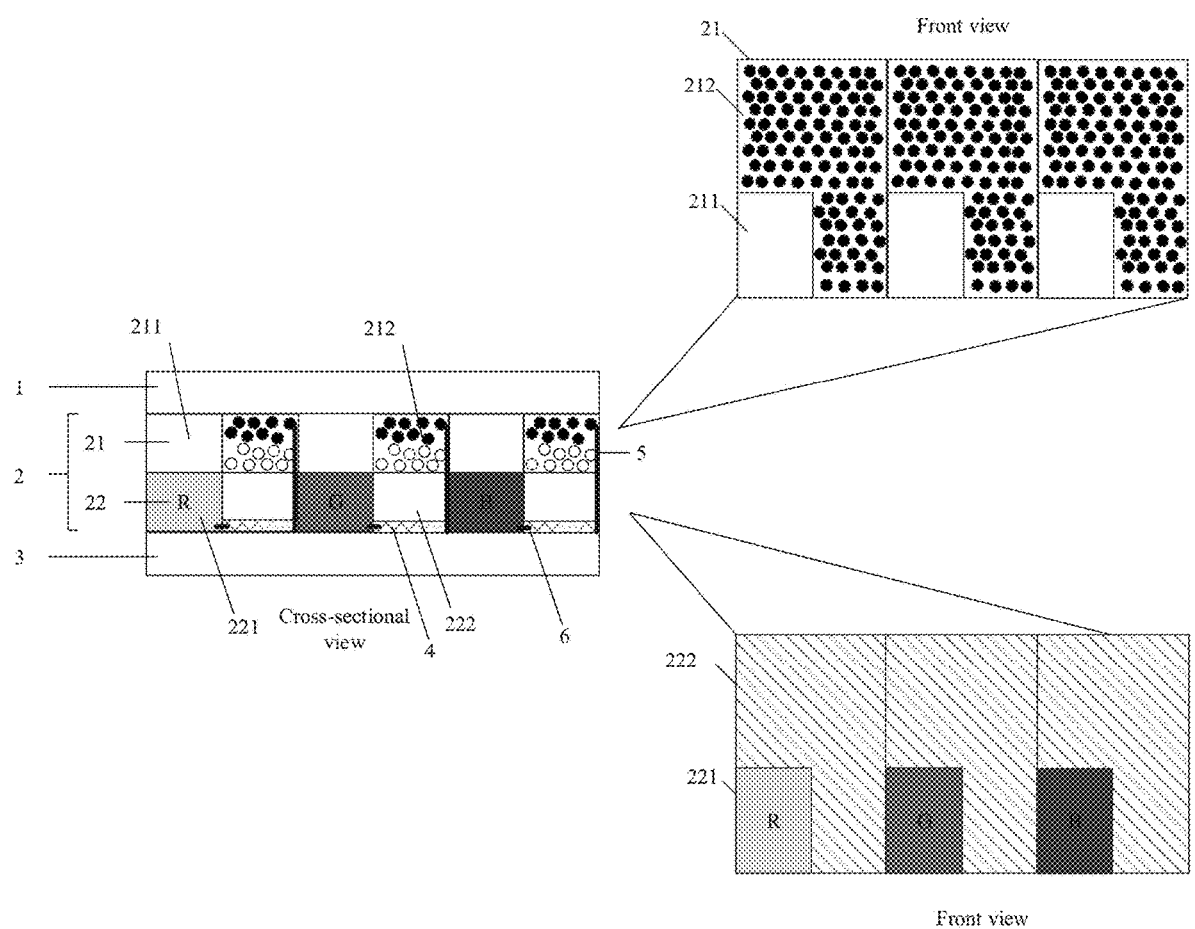
FIG. 9(a) is a schematic structural diagram of a first display according to an embodiment of this application.

As shown in FIG. 9(a), this application provides a display. A front view is based on a perspective opposite to an axis Z, that is, a perspective of looking towards the display, and a section of a cross-sectional view is parallel to an XZ plane. Along a direction opposite to the axis Z, the display includes a cover plate 1, a composite display layer 2, and a first substrate 3 from top to bottom, and the composite display layer 2 includes an ink filling layer 21 and an emissive display module layer 22 located below the ink filling layer 21.

The emissive display module layer 22 includes a plurality of arranged pixels, and each pixel includes an effective light transmitting zone 221 and a non-effective light transmitting zone 222. The effective light transmitting zone 221 includes an emissive luminescent material, and is used to display one of R, G, and B color components. The non-effective light transmitting zone 222 is made of a transparent resin material, and is not used as a light-emitting zone of the pixel. A smallest structural unit of the emissive display module layer 22 is a pixel, each pixel is used to display one color component, three adjacent pixels form one pixel zone, and one pixel zone is a smallest display unit to implement full color gamut display.

The ink filling layer 21 includes a first zone 211 corresponding to the effective light transmitting zone 221 and a second zone 212 corresponding to the non-effective light transmitting zone 222. "Corresponding to" means that the two zones are the same or approximately the same in shape and size on the XY plane, and have orthographic projections in the axis-Z direction that can completely overlap. Certainly, "completely overlap" in the axis-Z direction, namely, the projection direction, may have a deviation in product implementation. In this application, the first zone 211 and the second zone 212 are surrounded and separated by a retaining wall, the first zone 211 may not be filled with materials, the second zone 212 is filled with an electronic ink material, and light emitted by the effective light transmitting zone 221 of the emissive display module layer 22 can pass through the first zone 211 of the ink filling layer and exit the display.

In this application, the display further includes a thin-film transistor TFT electrode layer 4, and the TFT electrode layer 4 corresponds to the non-effective light transmitting zone 222. Similar to the foregoing definition, "corresponding to" means that the two zones are the same or approximately the same in shape and size on the XY plane, and have orthographic projections in the axis-Z direction that can completely or approximately overlap. As mentioned above, the non-effective light transmitting zone 222 is disposed corresponding to the second zone 212, which also means that the TFT electrode layer 4 corresponds to the second zone 212.

The TFT electrode layer 4 is used to drive the ink filling layer 21 and the emissive display module layer 22 to display. As shown in FIG. 9(a), at the composite display layer 2, the ink filling layer 21 is located above the emissive display module layer 22, the TFT electrode layer 4 is located at the bottom of the non-effective light transmitting zone 222 of the emissive display module layer 22, the second zone 212 of the ink filling layer 21 is connected to a first drive data cable 5, the first drive data cable 5 enters the non-effective light transmitting zone 222 and is connected to the TFT electrode layer 4, and the effective light transmitting zone 221 of the emissive display module layer 22 is connected to the TFT electrode layer 4 by using a second drive data cable 6.

Figure 9B:
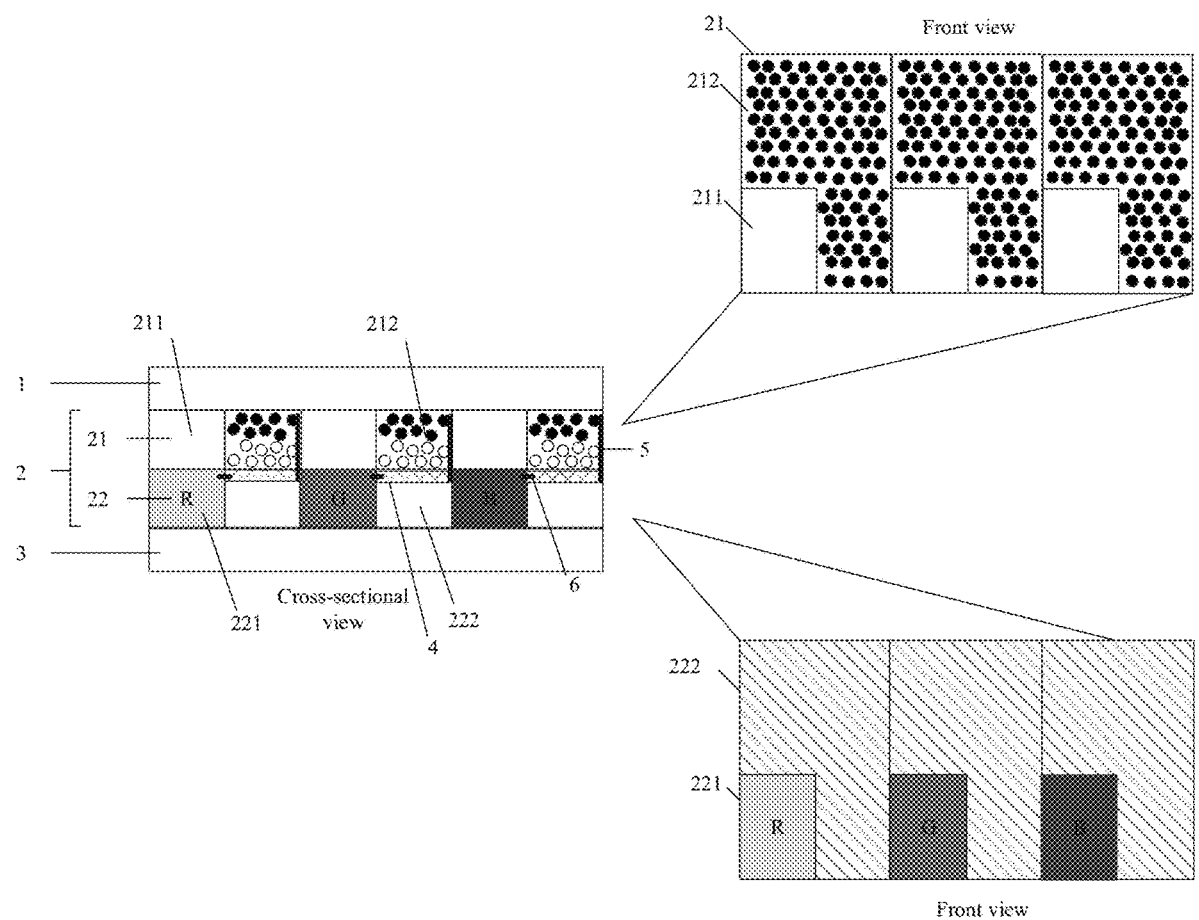
FIG. 9(b) is a schematic structural diagram of a second display according to an embodiment of this application.

In the solution of FIG. 9(a), the TFT electrode layer 4 is provided at the bottom of the non-effective light transmitting zone 222. In addition, the TFT electrode layer 4 may alternatively be arranged at the top of the non-effective light transmitting zone, as shown in FIG. 9(b).

Figure 9C:
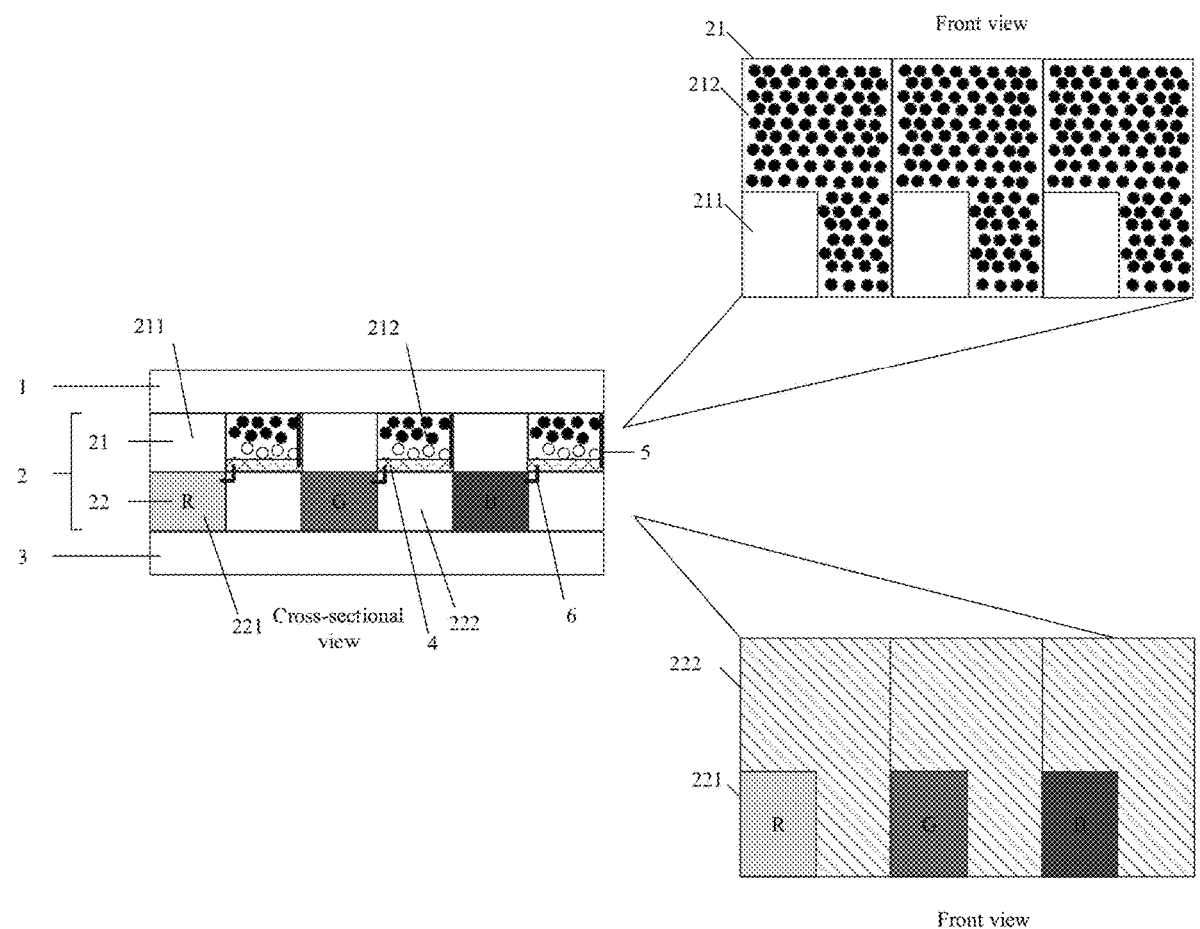
FIG. 9(c) is a schematic structural diagram of a third display according to an embodiment of this application.

In another implementation, as shown in FIG. 9(c), the TFT electrode layer 4 may be provided at the ink filling layer 21. In order to avoid blocking the effective light transmitting zone 221 of the emissive display module layer 22, the TFT electrode layer 4 may be provided at the bottom of the second zone 212 of the ink filling layer 21. In this manner, the second zone 212 of the ink filling layer 21 is connected to the TFT electrode layer 4 by using a first drive data cable 5, and a second data cable 6 passes through the non-effective light transmitting zone 222 and is connected to the TFT electrode layer 4.

In this solution, in a grayscale display mode, the ink filling layer 21 is used for display. In this case, the electronic ink material of the ink filling layer 21 is driven by the TFT electrode layer 4 to display different grayscale effects such as black, white, and gray in the second zone 212. In addition, the TFT electrode layer 4 cuts the power to the emissive display module layer 22, so that the effective light transmitting zone 221 turns black and no longer emits RGB light, to avoid display interference with the ink filling layer.

In a color display mode, the emissive display module layer 22 is used for display. In this case, the TFT electrode layer 4 controls the effective light transmitting zone 221 at the emissive display module layer 22 to emit RGB light, to display color content. In addition, the TFT electrode layer 4 drives the electronic ink material at the ink filling layer 21, so that the second zone 212 turns black. This can occlude the TFT electrode layer 4 at the bottom of second zone 212 to prevent ambient light reflected by TFT wiring from interfering with display at the emissive display module layer.

In this application, the second zone 212 turning black can effectively block external ambient light reflected by TFT wiring and can also minimize ambient light reflected by ink particles themselves. If the second zone 212 turns white, light mixing occurs after white light reflected by white ink particles is mixed with RGB light, resulting in a "whitish" display. Black light from black ink particles and RGB light have a higher contrast ratio, and therefore light mixing can be effectively resolved and display effects can be improved.

In an implementation, under a condition of moderately compromising a display effect, dark gray may be used to occlude TFT wiring, that is, the second zone 212 turns dark gray. For example, in the foregoing 16-level grayscale mode, if gray level 15 corresponds to a black display effect, display effects corresponding to gray level 8 to gray level 14 may be determined as dark gray effects. Alternatively, in the foregoing 8-level grayscale mode, if gray level 8 corresponds to a black display effect, display effects corresponding to gray level 4 to gray level 7 may be determined as dark gray effects.

Figure 10A:
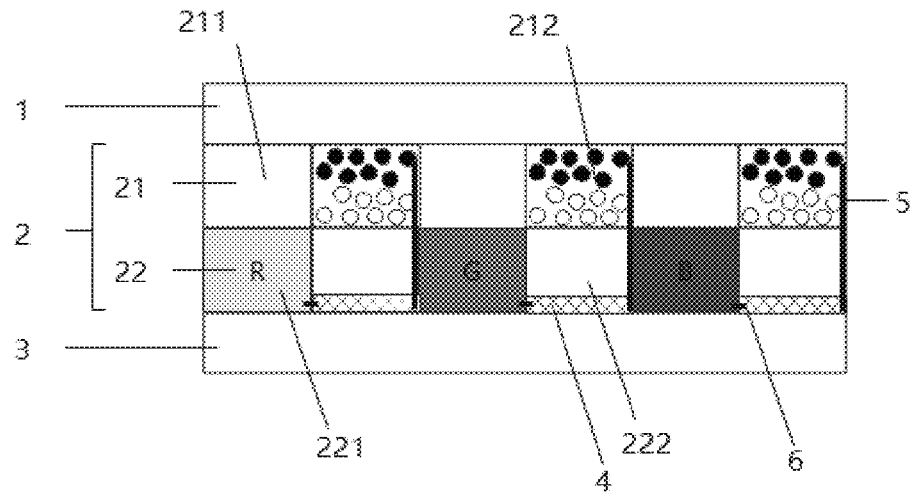
FIG. 10(a) is a schematic structural diagram of a fourth display according to an embodiment of this application.
Figure 10B:
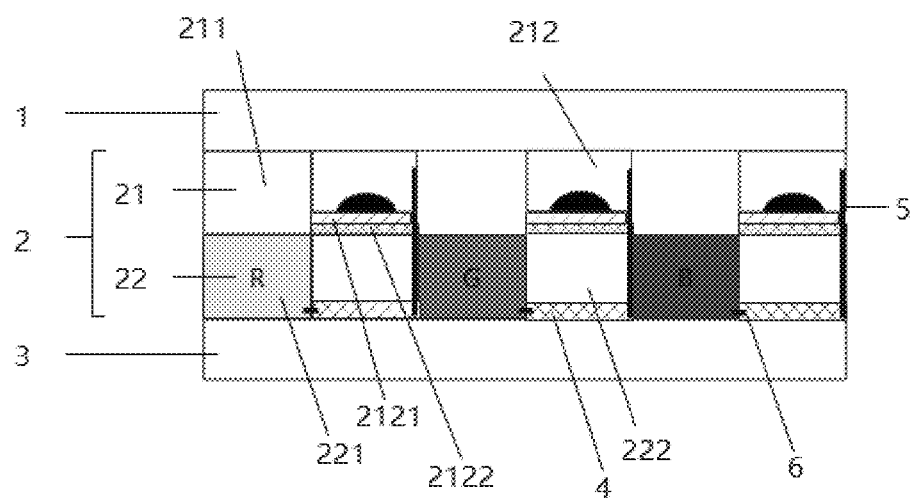
FIG. 10(b) is a schematic structural diagram of a fifth display according to an embodiment of this application.

The display proposed in this application may use a microcapsule ink material to fill the second zone 212, as shown in FIG. 10(a), or may use an electrowetting ink material to fill the second zone 212, as shown in FIG. 10(b). In the latter implementation, a transparent hydrophobic layer 2121 needs to be provided at a location corresponding to the second zone 212, and a reflective metal layer 2122 needs to be provided on a side of the transparent hydrophobic layer 2121 facing away from ink droplets. For driving methods of microcapsule ink particles and electrowetting ink droplets, refer to the foregoing description. Details are not repeated herein. The microcapsule ink material is used as an example for latter description in this application. Unless otherwise specified, the microcapsule solution can be replaced with an electrowetting solution.

Compared with the display in FIG. 8, the display provided in this application can avoid a PPI decrease of the display, and ensure a display resolution of the display. This is because in the solution in FIG. 8, adjacent pixel zones are used as an emissive display zone and a reflective display zone respectively. If a display has N pixels in total, the number of pixels used for emissive display and the number of pixels used for reflective display are both N/2. When one of the zones is used for display, the other zone is in an idle state and cannot be effectively used, resulting in that PPI of the display is halved. However, in this application, a reflective display mechanism and an emissive display mechanism are combined at a pixel level to stack the ink material on the non-effective light transmitting zone by utilizing a characteristic that the non-effective light transmitting zone in the emissive display zone does not emit light. Each pixel of the display can perform reflective display and emissive display. In other words, for the display, N pixels are available for emissive display, and the N pixels are also available for reflective display. Compared with the solution in FIG. 8, the PPI of the display is not decreased. In addition, in the prior art, when an effective light transmitting zone of an emissive display module layer emits light, a non-effective light transmitting zone itself does not emit light for display. Therefore, superimposing the ink material on the non-effective light transmitting zone does not affect the emissive display mechanism in this application.

Figure 11:
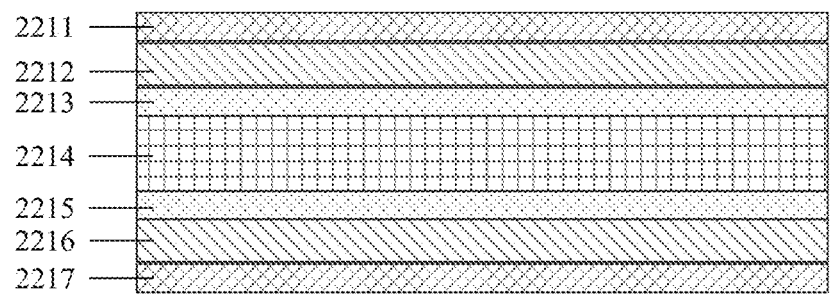
FIG. 11 is a schematic structural diagram of an emissive display module layer according to an embodiment of this application.

In one implementation, an OLED display module is used as the emissive display module layer 22. As shown in FIG. 11, the effective light transmitting zone 221 of the emissive display module layer 22 sequentially includes a cathode layer 2211, an electron injection layer 2212, an electron transport layer 2213, an organic self-luminous layer 2214, a hole transport layer 2215, a hole injection layer 2216, and an anode layer 2217 from top to bottom. RGB colors emitted by pixels are determined by organic materials of different colors added at the organic self-luminous layer 2214.

In the prior art, an aperture ratio of an OLED pixel is usually about 10%. The so-called aperture ratio is a ratio of a light transmitting zone of the pixel to the entire pixel, and the entire pixel includes the light transmitting zone and an opaque zone. In this application, referring to FIG. 9(a), an aperture ratio of an OLED pixel is equal to effective light transmitting zone 221/(effective light transmitting zone 221+non-effective light transmitting zone 222), or equivalent to first zone 211/(first zone 211+second zone 212).

Due to high luminous brightness of the OLED pixel, a low aperture ratio of the pixel does not affect display of the display. In this application, the second zone 212 with a higher area ratio is used to implement the electronic ink display. This can effectively ensure display density of the display in the grayscale display mode, thereby avoiding color distortion caused by too few ink particles. For example, when there are too few black ink particles, a light-colored gap between black dot matrices displayed on the display widens. As a result, a dark image becomes lighter to an observer. In addition, the low aperture ratio of the OLED pixel can also provide sufficient space for TFT wiring in the non-effective light transmitting zone 222.

In practical application, with no materials added in the first zone 211, the ink filling layer is inconsistent in thickness, affecting structural stability. Therefore, in an implementation of this application, the first zone 211 may be filled with a transparent resin material, and the material is the same as the ink material in thickness. In the solutions in FIG. 9(a) to FIG. 9(c), the transparent resin material does not occlude light emitted by the effective light transmitting zone, and therefore does not affect an OLED display effect.

Figure 12:
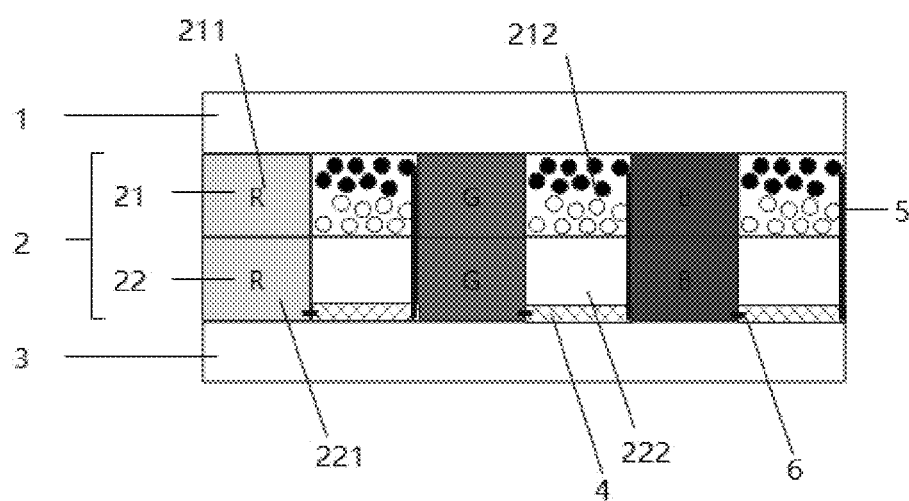
FIG. 12 is a schematic structural diagram of a sixth display according to an embodiment of this application.
Figure 13A:
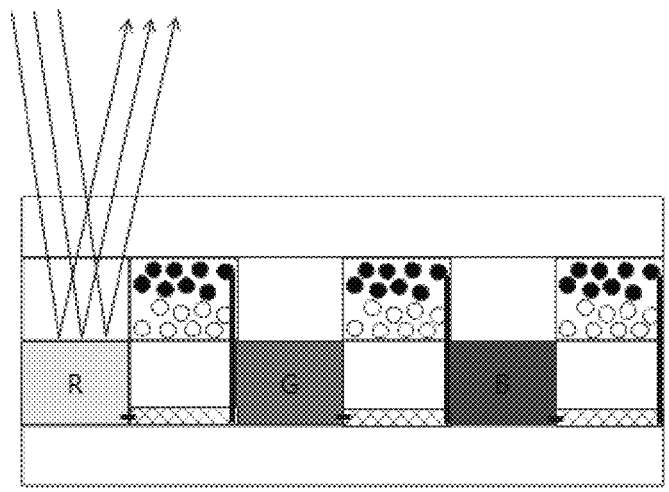
FIG. 13(a) is a schematic diagram of reflecting ambient light by a display according to an embodiment of this application.
Figure 13B:
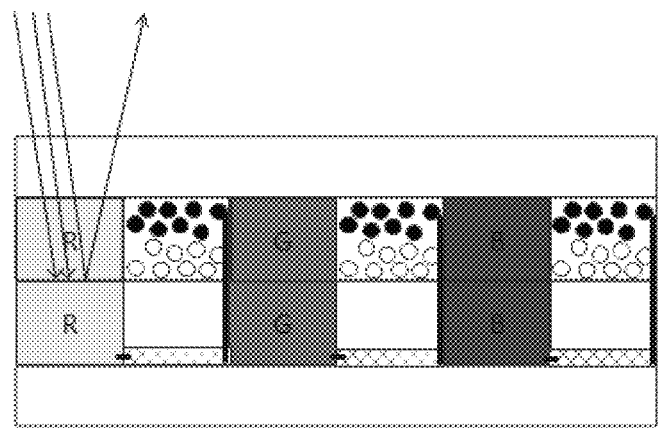
FIG. 13(b) is a schematic diagram of reflecting ambient light by another display according to an embodiment of this application.

Further, for the solutions in FIG. 9(a) to FIG. 9(c), the first zone 211 may alternatively be filled with a color light filter film instead of the transparent resin. As shown in FIG. 12, the first zone 211 is filled with a color light filter film instead of the transparent resin. When a thickness of the color light filter film is smaller than a thickness of the first zone 211, multiple color light filter films may be stacked, so that a total thickness of the stacked color light filter films is or approximately the same as the thickness of the first zone 211. In addition, a color of the added color light filter films is the same as a color of pixels in the effective light transmitting zone 221 below the color light filter films. In this solution, a purpose of adding the color light filter film is to reduce ambient light reflected by the effective light transmitting zone 221. As mentioned above, an upper layer of the OLED display module includes the cathode layer that is usually made of a metal material and therefore can reflect light. As shown in FIG. 13(a), upon entering the display along an opposite direction of the axis Z, external ambient light is reflected out of the display by the cathode layer, resulting in chromatic aberration in a pixel color seen by an observer. For example, the color becomes lighter. The color light filter film can polarize and filter the ambient light. As shown in FIG. 13(b), when ambient light irradiates on the color light filter film, only light whose component corresponds to a color of the filter film can pass through the color filter film and reach the cathode layer. This reduces the amount of incident light and reduces light reflection. In addition, when the incident light is reflected out of the color light filter film, because the color of the light is the same as the color of the color light filter film, chromatic aberration can be "corrected" to avoid lightening of the displayed color. In addition, in practical application, the first zone 211 may alternatively be filled with a transparent resin material, and a color light filter film may be added over or under the transparent resin material.

In addition to the advantages described above, the display in FIG. 12 has the following advantage over the traditional OLED display: no need to add a polarizer at an upper layer of the OLED display module. In the prior art, a cathode layer in which OLED pixels are located, and TFT wiring in a non-effective light transmitting zone 222 both reflect external ambient light, affecting display quality. Therefore, a polarizer is added above an OLED display module to reduce the amount of light entering and exiting the LOED display module, so as to reduce display reflection. In this solution, the color light filter film is used to reduce light reflected by OLED pixels, and the ink material displayed in black is used to occlude TFT wiring to prevent light reflection, so that display reflection is resolved without using a polarizer.

In another implementation of this application, a second substrate 23 is further provided between the ink filling layer 21 and the emissive display module layer 22, and a micro through-hole is formed in the second substrate 23 through drilling or chemical etching, so that the first drive data cable 5 or the second drive data cable 6 is connected to the TFT electrode layer 4 through the micro through-hole. In this application, the second substrate is added between the ink filling layer 21 and the emissive display module layer 22, so that the support strength can be further increased for the display.

Figure 14A:
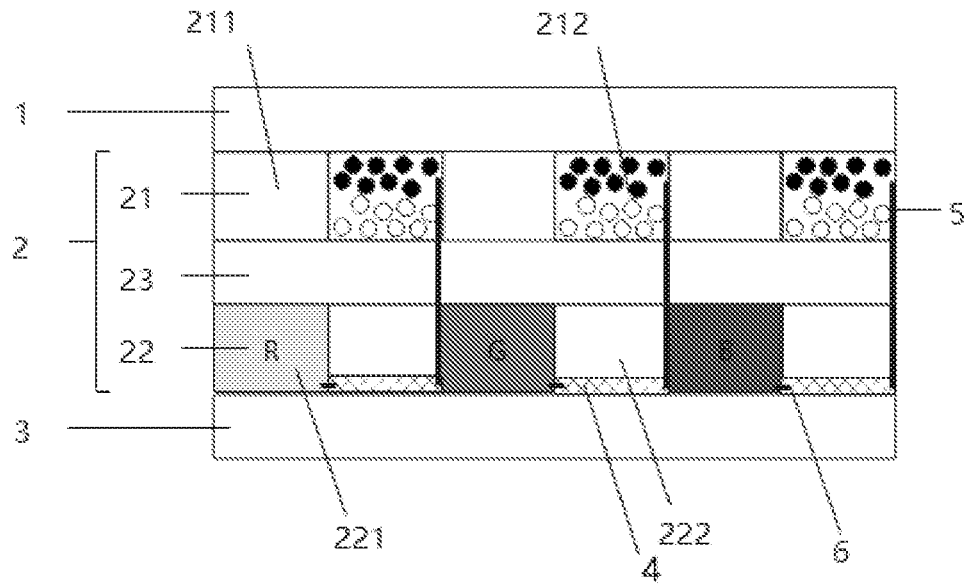
FIG. 14(a) is a schematic structural diagram of a seventh display according to an embodiment of this application.
Figure 14B:
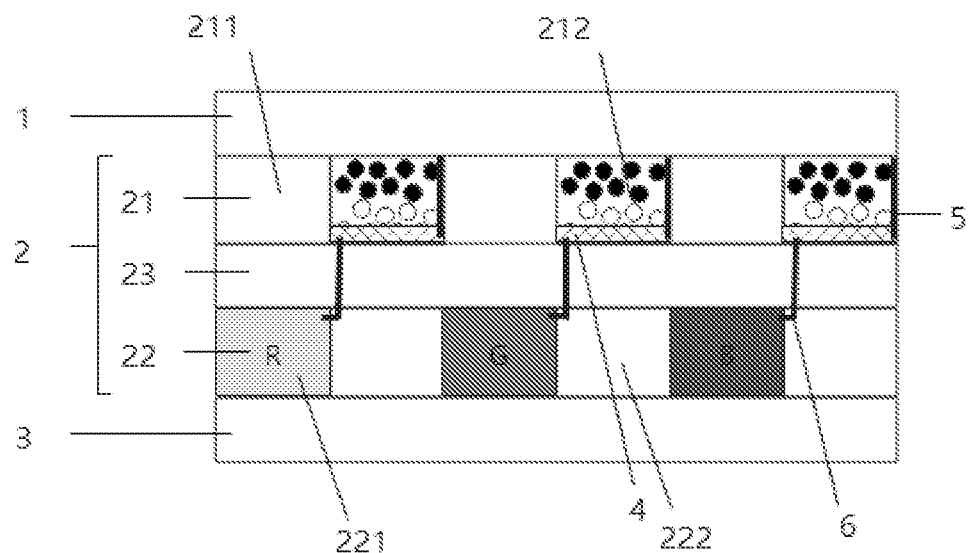
FIG. 14(b) is a schematic structural diagram of an eighth display according to an embodiment of this application.

FIG. 14(a) shows a display with a second substrate 23 added on the basis of FIG. 9(a). In FIG. 14(a), the second substrate 23 is located between the ink filling layer 21 and the emissive display module layer 22, and the TFT electrode layer 4 is located on a side of the non-effective light transmitting zone 222 adjacent to the first substrate 23. The first drive data cable 5 enters the non-effective light transmitting zone 222 through the micro through-hole in the second substrate 23 and is connected to the TFT electrode layer 4. FIG. 14(b) shows a display with a second substrate 23 added on the basis of FIG. 9(c). In FIG. 14(b), the second substrate 23 is also located between the ink filling layer 21 and the emissive display module layer 22, and the TFT electrode layer 4 is located on a side of the second zone 212 adjacent to the second substrate 23. The second drive data cable 6 enters the second zone 212 through the micro through-hole in the second substrate 23 and is connected to the TFT electrode layer 4.

Figure 15A:
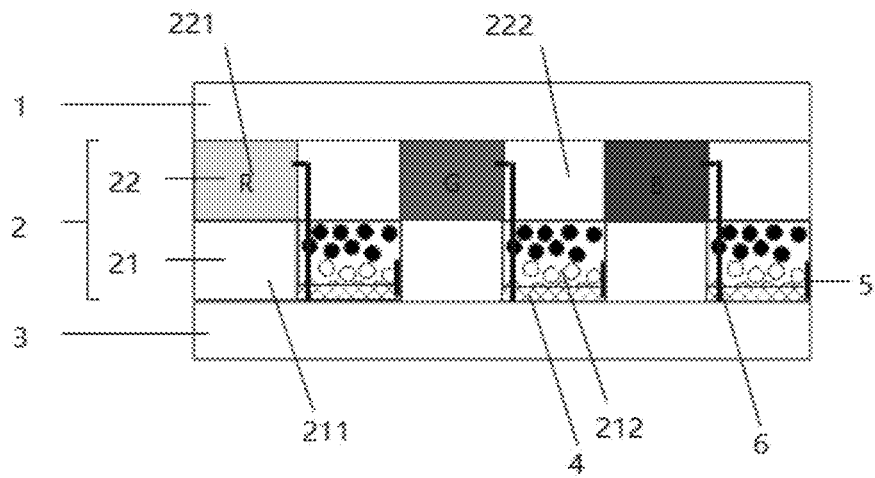
FIG. 15(a) is a schematic structural diagram of a ninth display according to an embodiment of this application.

In an implementation of this application, the ink filling layer 21 may be located below the emissive display module layer 22. As shown in FIG. 15(a), a display includes a cover plate 1, a composite display layer 2, and a first substrate 3 from top to bottom, where the composite display layer 2 includes an emissive display module layer 22, a second substrate 23, and an ink filling layer 21 from top to bottom, a TFT electrode layer 4 is located on a side of a second zone 212 adjacent to the first substrate 3, and a second drive data cable 6 enters the second zone 212 and is connected to the TFT electrode layer 4.

Figure 15B:
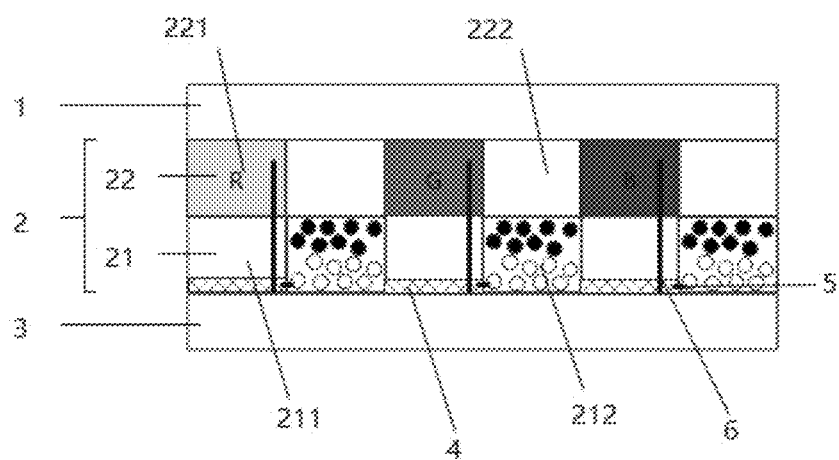
FIG. 15(b) is a schematic structural diagram of a tenth display according to an embodiment of this application.

In another implementation, the TFT electrode layer 4 may be disposed in the first zone 211 of the ink filling layer 21. As shown in FIG. 15(b), the TFT electrode layer 4 is located on a side of the first zone 211 adjacent to the first substrate 3, and the second drive data cable 6 enters the first zone 211 and is connected to the TFT electrode layer 4.

Figure 16:
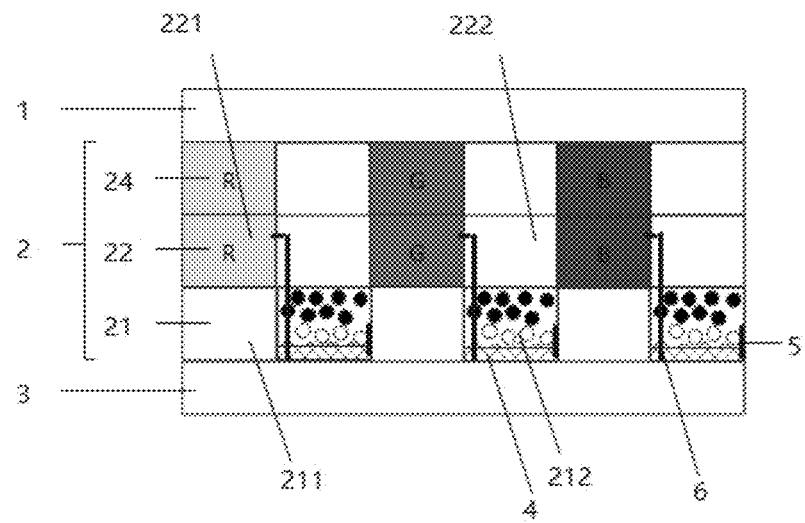
FIG. 16 is a schematic structural diagram of an eleventh display according to an embodiment of this application.

Further, on the basis of the solutions in FIG. 15(a) and FIG. 15(b), a color light filter film may be further added above the emissive display module layer 22 to reduce ambient light reflected by the effective light transmitting zone 221. For example, on the basis of the display in FIG. 15(a), as shown in FIG. 16, the composite display layer 2 further includes a color light filter film 24, and a color of the color light filter film 24 is the same as a pixel color in the effective light transmitting zone 221. In FIG. 16, no material is provided at a location, corresponding to the non-effective light transmitting zone 222, in the color light filter film, leaving the non-effective light transmitting zone 222 uncovered. In practical application, a transparent film material may alternatively be provided at a location, corresponding to the non-effective light transmitting zone 222, in the color light filter film 24, and the transparent film material is integrally formed with a color zone above the effective light transmitting zone 221.

Figure 17A:
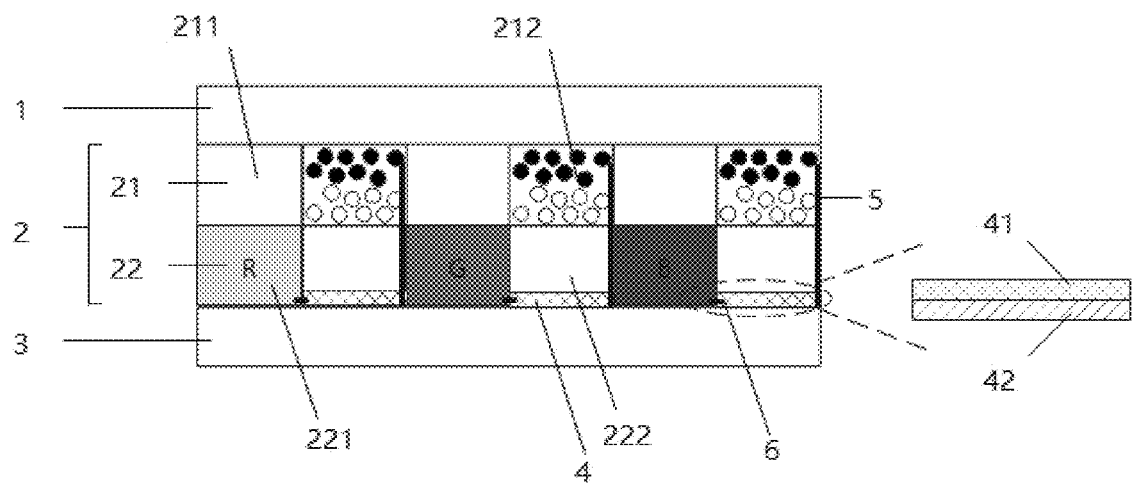
FIG. 17(a) is a schematic diagram of arrangement of a TFT electrode layer according to an embodiment of this application.

Further, the TFT electrode layer 4 includes an ink driven electrode layer 41 and an emissive display driven electrode layer 42. The ink driven electrode layer 41 is connected to the second zone 212 of the ink filling layer 21 through the first drive data cable 5, and the emissive display driven electrode layer 42 is connected to the effective light transmitting zone 221 through the second drive data cable 6. As shown in FIG. 17(a), the ink driven electrode layer 41 is formed on the emissive display driven electrode layer 42, and the emissive display driven electrode layer 42 is formed on the first substrate 3; or the emissive display driven electrode layer 42 may be formed on the ink driven electrode layer 41, and the ink driven electrode layer 41 is formed on the first substrate 3 (not shown in the figure). In practical application, a low temperature poly-silicon (Low Temperature Poly-silicon, LTPS for short) process may be used to form the TFT electrode layer 4.

Figure 17B:
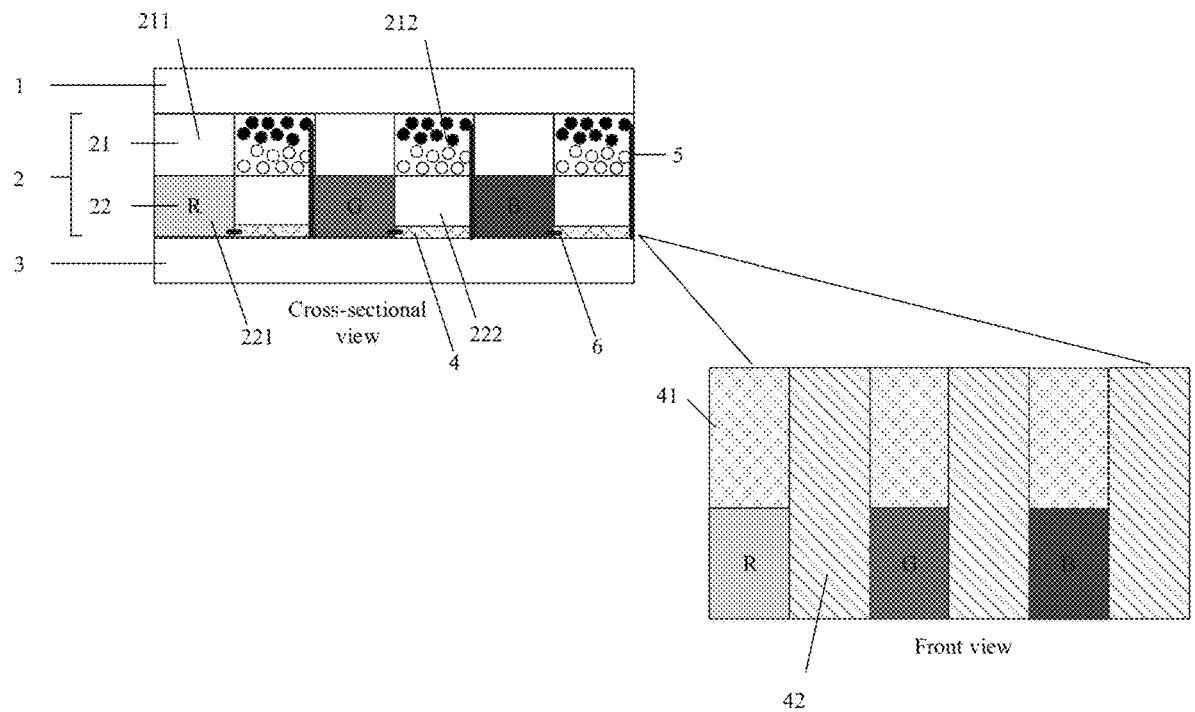
FIG. 17(b) is a schematic diagram of arrangement of another TFT electrode layer according to an embodiment of this application.

In another implementation of this application, the ink driven electrode layer 41 and the emissive display driven electrode layer 42 may be provided at a same layer, that is, to form a TFT electrode layer. As shown in FIG. 17(b), the TFT electrode layer 4 is divided into zones on an XY plane, the left zone is the ink driven electrode layer 41, and the right zone is the emissive display driven electrode layer 42. Alternatively, in the same-layer layout solution, TFT circuits of the ink driven electrode layer 41 and the emissive display driven electrode layer 42 may be arranged without clear discrimination between their electrode zones, so as to fully utilize space of the non-effective light transmitting zone 222. Compared with FIG. 17(a), in FIG. 17(b), two kinds of driven electrode layers can be formed by using one etching process, thereby simplifying a process of the display.

Figure 18A:
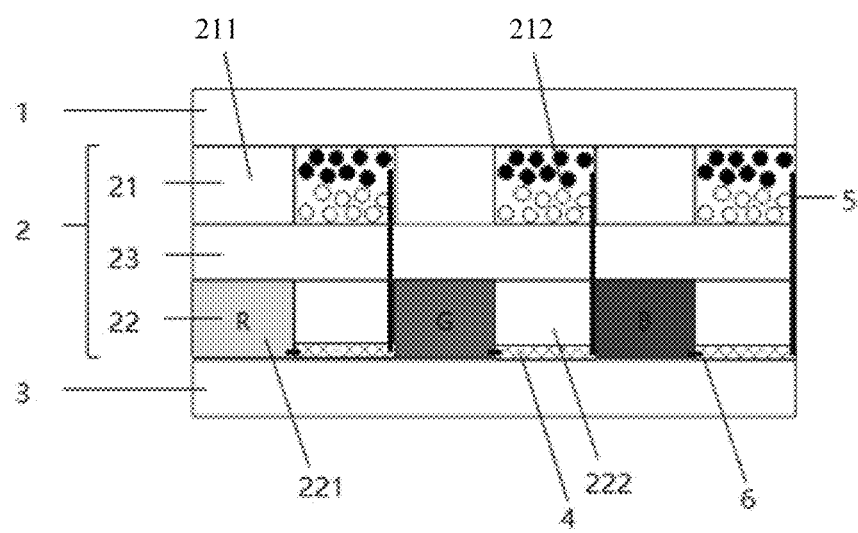
FIG. 18(a) is a schematic diagram of wiring of a drive data cable according to an embodiment of this application.

In an implementation, the first drive data cable 5 may be one or more drive data cables, and the second drive data cable 6 may also be one or more drive data cables. As shown in FIG. 18(a), the first drive data cable 5 may be wired close to a boundary of the effective light transmitting zone 222 in the non-effective light transmitting zone 222, or the first drive data cable 5 may be arranged at any other location (not shown in the figure) in the non-effective light transmitting zone 222. This application does not limit the first drive data cable in wiring location and wiring direction.

Figure 18B:
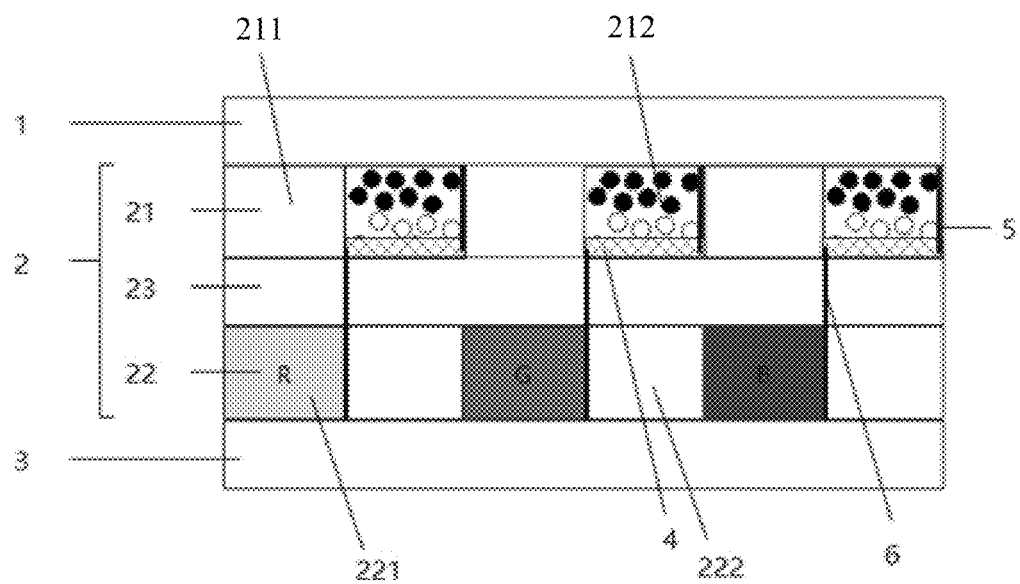
FIG. 18(b) is a schematic diagram of wiring of another drive data cable according to an embodiment of this application.

As shown in FIG. 18(b), in another implementation, when the TFT electrode layer 4 is formed on the second substrate 23, the second drive data cable 6 is wired close to a boundary of the non-effective light transmitting zone 222 in the non-effective light transmitting zone 222, and runs through the second substrate 23 to be connected to the TFT electrode layer 4.

Figure 19:
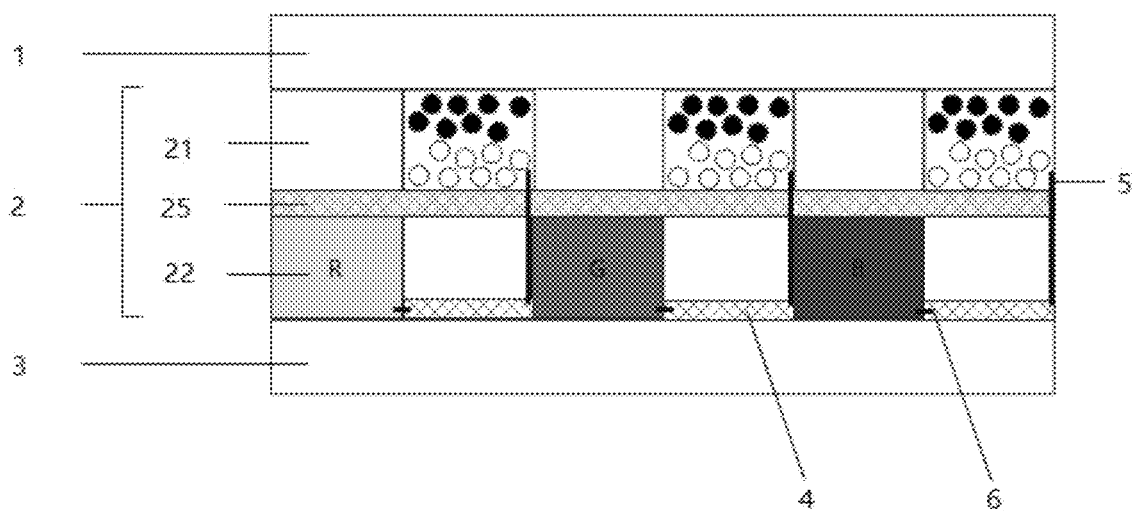
FIG. 19 is a schematic structural diagram of a twelfth display according to an embodiment of this application.

To further reduce the thickness of the display, the second substrate 23 may alternatively be replaced with a flexible base material. As shown in FIG. 19, the composite display layer includes an ink filling layer 21, a first flexible thin film 25, and an emissive display module layer 22 from top to bottom. A through-hole is formed in the first flexible thin film 25 for the first drive data cable 5 or the second drive data cable 6 to pass through.

A thickness of the flexible base material is about 0.005 mm, which is negligible compared with a thickness of the substrate. The flexible base material in this solution may be made of a resin or silicon nitride (SiNx) material. Compared with the solution in FIG. 14(a) and/or FIG. 14(b), this solution optimizes the three-layer substrate structure into a two-layer substrate structure, and therefore can reduce the thickness of the display to 0.3 mm.

Figure 20:
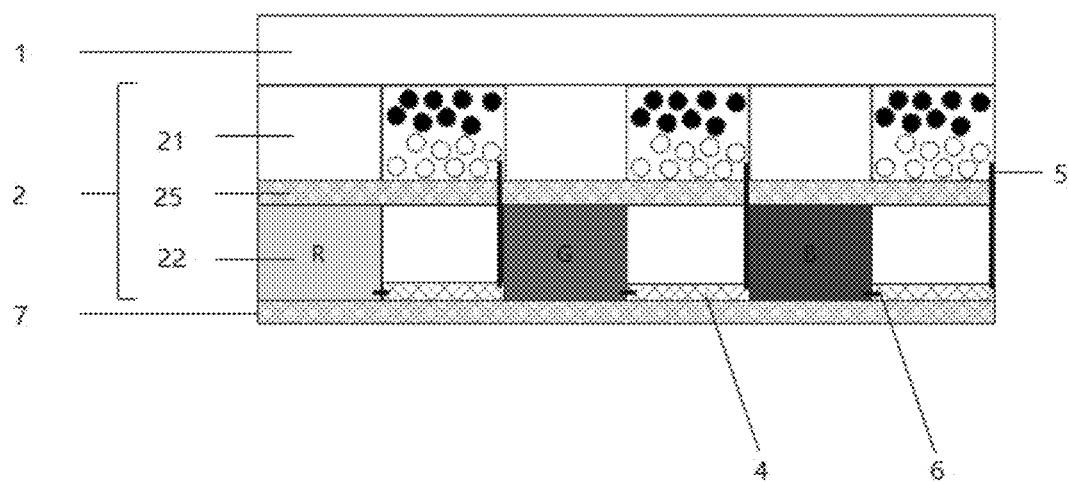
FIG. 20 is a schematic structural diagram of a thirteenth display according to an embodiment of this application.

Further, the first substrate 3 may alternatively be replaced with a flexible base material. As shown in FIG. 20, a display includes a cover plate 1, a composite display layer 2, and a second flexible thin film 7 from top to bottom. As shown in FIG. 19, the composite display layer 2 includes an ink filling layer 21, a first flexible thin film 25, and an emissive display module layer 22. This solution can optimize the two-layer substrate structure in FIG. 19 into a one-layer substrate structure, and therefore can further reduce the thickness of the display to 0.15 mm.

Figure 21:
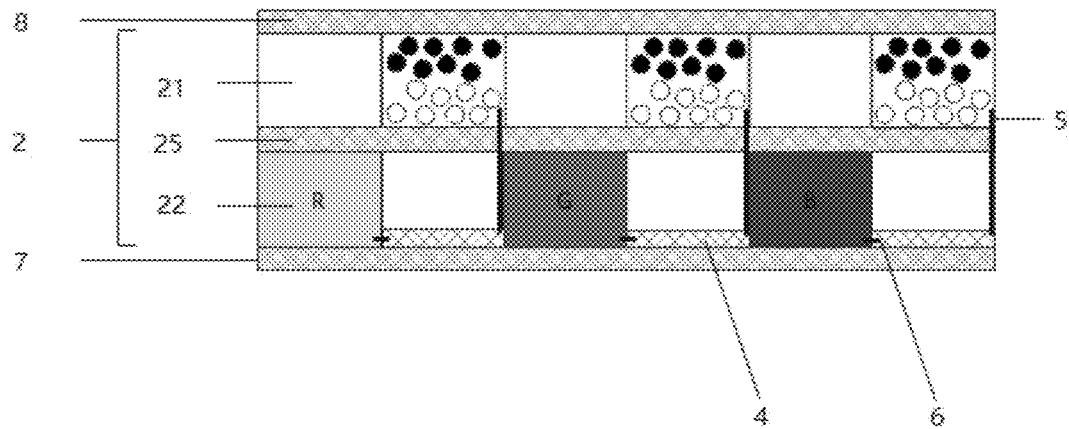
FIG. 21 is a schematic structural diagram of a fourteenth display according to an embodiment of this application.

Still further, the cover plate 1 may alternatively be replaced with a flexible base material. As shown in FIG. 21, a display includes a third flexible thin film 8, a composite display layer 2, and a second flexible thin film 7 from top to bottom. As shown in FIG. 19, the composite display layer 2 includes an ink filling layer 21, a first flexible thin film 25, and an emissive display module layer 22. This solution can completely eliminate the use of a cover plate/substrate, and an overall thickness of the display can be controlled at about 0.05 mm. Compared with the thickness of 0.6 mm of the display in FIG. 8, the thickness can be reduced by 91.6%. In addition, the solution in FIG. 19 can be used for a flexible display.

In the description of this application, it should be noted that unless otherwise specified and defined explicitly, the terms "mount", "connect", and "join" are to be interpreted broadly. For example, they may refer to a fixed connection, or detachable connection, or an integral union, may refer to a mechanical connection or electrical connection, and may refer to a direct connection or indirect connection through an intermediate medium, or internal communication between two elements. A person of ordinary skill in the art can understand specific meanings of these terms in this application as appropriate to specific situations.

The foregoing descriptions are only specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A display, wherein the display comprises a cover plate, a composite display layer, and a first substrate from top to bottom, and the composite display layer comprises an ink filling layer and an emissive display module layer;
    the emissive display module layer comprises a plurality of pixels, each pixel comprises an effective light transmitting zone and a non-effective light transmitting zone, and the effective light transmitting zone comprises an emissive luminescent material;
    the ink filling layer comprises a first zone corresponding to the effective light transmitting zone and a second zone corresponding to the non-effective light transmitting zone, and the second zone is filled with an electronic ink material, wherein the first zone is covered with a color light filter film, and a color of the color light filter film is the same as a pixel color in the effective light transmitting zone; and
    the display comprises a thin-film transistor (TFT) electrode layer, the TFT electrode layer corresponds to the non-effective light transmitting zone, the ink filling layer is connected to the TFT electrode layer by using a first drive data cable, and the emissive display module layer is connected to the TFT electrode layer by using a second drive data cable.

2. The display according to claim 1, wherein the ink filling layer is located above the emissive display module layer.

3. The display according to claim 2, wherein the display further comprises a second substrate, the second substrate is located between the ink filling layer and the emissive display module layer, and the TFT electrode layer is located on a side of the non-effective light transmitting zone adjacent to the first substrate; and
    a micro through-hole is provided in the second substrate, and the first drive data cable enters the non-effective light transmitting zone through the micro through-hole and is connected to the TFT electrode layer.

4. The display according to claim 2, wherein the display further comprises a second substrate, the second substrate is located between the ink filling layer and the emissive display module layer, and the TFT electrode layer is located on a side of the second zone adjacent to the second substrate; and
    a micro through-hole is provided in the second substrate, and the second drive data cable enters the second zone through the micro through-hole and is connected to the TFT electrode layer.

5. The display according to claim 1, wherein the first zone is filled with a transparent resin material.

6. The display according to claim 1, wherein the TFT electrode layer comprises an ink driven electrode layer and an emissive display driven electrode layer.

7. The display according to claim 6, wherein the ink driven electrode layer and the emissive display driven electrode layer are stacked together.

8. The display according to claim 6, wherein the ink driven electrode layer and the emissive display driven electrode layer are provided at a same layer.

9. The display according to claim 1, wherein the cover plate or the first substrate is a glass base material.

10. The display according to claim 1, wherein the cover plate or the first substrate is a flexible base material.

11. The display according to claim 1, wherein in a grayscale display mode, the TFT electrode layer controls the second zone of the ink filling layer to display grayscale effects, and controls the effective light transmitting zone of the emissive display module layer to turn black.

12. The display according to claim 1, wherein in a color display mode, the TFT electrode layer controls the effective light transmitting zone of the emissive display module layer to turn colored, and controls the second zone of the ink filling layer to turn black.

13. The display according to claim 1, wherein the second zone is filled with a microcapsule ink material or an electrowetting ink material.

14. The display according to claim 1, wherein the second zone is filled with an electrowetting ink material, and the emissive display module layer is an OLED display layer, wherein
    in the second zone, a transparent hydrophobic layer is disposed below ink droplets, and a reflective metal layer is disposed on a side of the transparent hydrophobic layer facing away from the ink droplets; and
    the effective light transmitting zone comprises a cathode layer, an electron injection layer, an electron transport layer, an organic self-luminous layer, a hole transport layer, a hole injection layer, and an anode layer from top to bottom, wherein the organic self-luminous layer is added with organic display materials of different colors.

15. A terminal device comprising a display, the display comprising:
    a cover plate, a composite display layer, and a first substrate from top to bottom, and the composite display layer comprises an ink filling layer and an emissive display module layer, wherein
    the emissive display module layer comprises a plurality of pixels, each pixel comprises an effective light transmitting zone and a non-effective light transmitting zone, and the effective light transmitting zone comprises an emissive luminescent material;
    the ink filling layer comprises a first zone corresponding to the effective light transmitting zone and a second zone corresponding to the non-effective light transmitting zone, and the second zone is filled with an electronic ink material; and the display comprises a thin-film transistor (TFT) electrode layer, the TFT electrode layer corresponds to the non-effective light transmitting zone, the ink filling layer is connected to the TFT electrode layer by using a first drive data cable, and the emissive display module layer is connected to the TFT electrode layer by using a second drive data cable, wherein the ink filling layer is located below the emissive display module layer.

16. A display, wherein the display comprises a cover plate, a composite display layer, and a first substrate from top to bottom, and the composite display layer comprises an ink filling layer and an emissive display module layer;

the emissive display module layer comprises a plurality of pixels, each pixel comprises an effective light transmitting zone and a non-effective light transmitting zone, and the effective light transmitting zone comprises an emissive luminescent material;

the ink filling layer comprises a first zone corresponding to the effective light transmitting zone and a second zone corresponding to the non-effective light transmitting zone, and the second zone is filled with an electronic ink material;

the display comprises a thin-film transistor (TFT) electrode layer, the TFT electrode layer corresponds to the non-effective light transmitting zone, the ink filling layer is connected to the TFT electrode layer by using a first drive data cable, and the emissive display module layer is connected to the TFT electrode layer by using a second drive data cable;

wherein the display further comprises a second substrate, the second substrate is located between the ink filling layer and the emissive display module layer, and the TFT electrode layer is located on a side of the non-effective light transmitting zone adjacent to the first substrate and a micro through-hole is provided in the second substrate, and the first drive data cable enters the non-effective light transmitting zone through the micro through-hole and is connected to the TFT electrode layer, or the TFT electrode layer is located on a side of the second zone adjacent to the second substrate, and the micro through-hole is provided in the second substrate, and the second drive data cable enters the second zone through the micro through-hole and is connected to the TFT electrode layer.

17. The terminal device according to claim 15, wherein the ink filling layer is located below the emissive display module layer, and wherein the display further comprises a second substrate, the second substrate is located between the ink filling layer and the emissive display module layer, and the TFT electrode layer is located on a side of the second zone adjacent to the first substrate; and a micro through-hole is provided in the second substrate, and the second drive data cable enters the second zone through the micro through-hole and is connected to the TFT electrode layer.

18. The terminal device according to claim 15, wherein the display further comprises a second substrate, the second substrate is located between the ink filling layer and the emissive display module layer, and the TFT electrode layer is located on a side of the first zone adjacent to the first substrate; and a micro through-hole is provided in the second substrate, and the second drive data cable enters the first zone through the micro through-hole and is connected to the TFT electrode layer.

19. The terminal device according to claim 15, wherein the effective light transmitting zone is covered with a color light filter film, and a color of the color light filter film is the same as a pixel color in the effective light transmitting zone.

* * * * *